(12) United States Patent
Asao et al.

(10) Patent No.: US 6,590,244 B2
(45) Date of Patent: Jul. 8, 2003

(54) SEMICONDUCTOR MEMORY DEVICE USING MAGNETO RESISTIVE EFFECT ELEMENT

(75) Inventors: Yoshiaki Asao, Yokohama (JP); Kazumasa Sunouchi, Yokohama (JP); Kentaro Nakajima, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/101,702

(22) Filed: Mar. 21, 2002

(65) Prior Publication Data

US 2002/0140060 A1 Oct. 3, 2002

(30) Foreign Application Priority Data

Mar. 29, 2001 (JP) ........................... 2001-096682
Feb. 14, 2002 (JP) ........................... 2002-037327

(51) Int. Cl.[7] .................. H01L 29/76; H01L 31/113; H01L 31/119
(52) U.S. Cl. ........................ 257/295; 257/421
(58) Field of Search ........................ 257/295, 421

(56) References Cited

U.S. PATENT DOCUMENTS 6,211,005 B1 * 4/2001 Kang ........................ 438/238

2001/0035545 A1  11/2001  Schuster-Woldan et al.

FOREIGN PATENT DOCUMENTS

| JP | 2000-357389 | 12/2000 |
| JP | 2001-217398 | 8/2001 |
| JP | 2001-357666 | 12/2001 |

* cited by examiner

*Primary Examiner*—David Nelms
*Assistant Examiner*—Tu-Tu Ho
(74) *Attorney, Agent, or Firm*—Oblon, Spivak, McClelland, Maier & Neustadt, P.C.

(57) ABSTRACT

A memory cell section includes a first wiring which is extended in a first direction, and a second wiring which is extended in a second direction different from the first direction, and a third wiring which is disposed between the first and second wirings, and a first magneto resistive effect element which is disposed at an intersection of the first and second wirings between the first and second wirings, and is connected to the second and third wirings. Further, a peripheral circuit section includes a fourth wiring, and a fifth wiring which is disposed above the fourth wiring, and a second magneto resistive effect element which is disposed between the fourth and fifth wirings and is connected to the fourth and fifth wirings to be used as a resistive element.

20 Claims, 33 Drawing Sheets

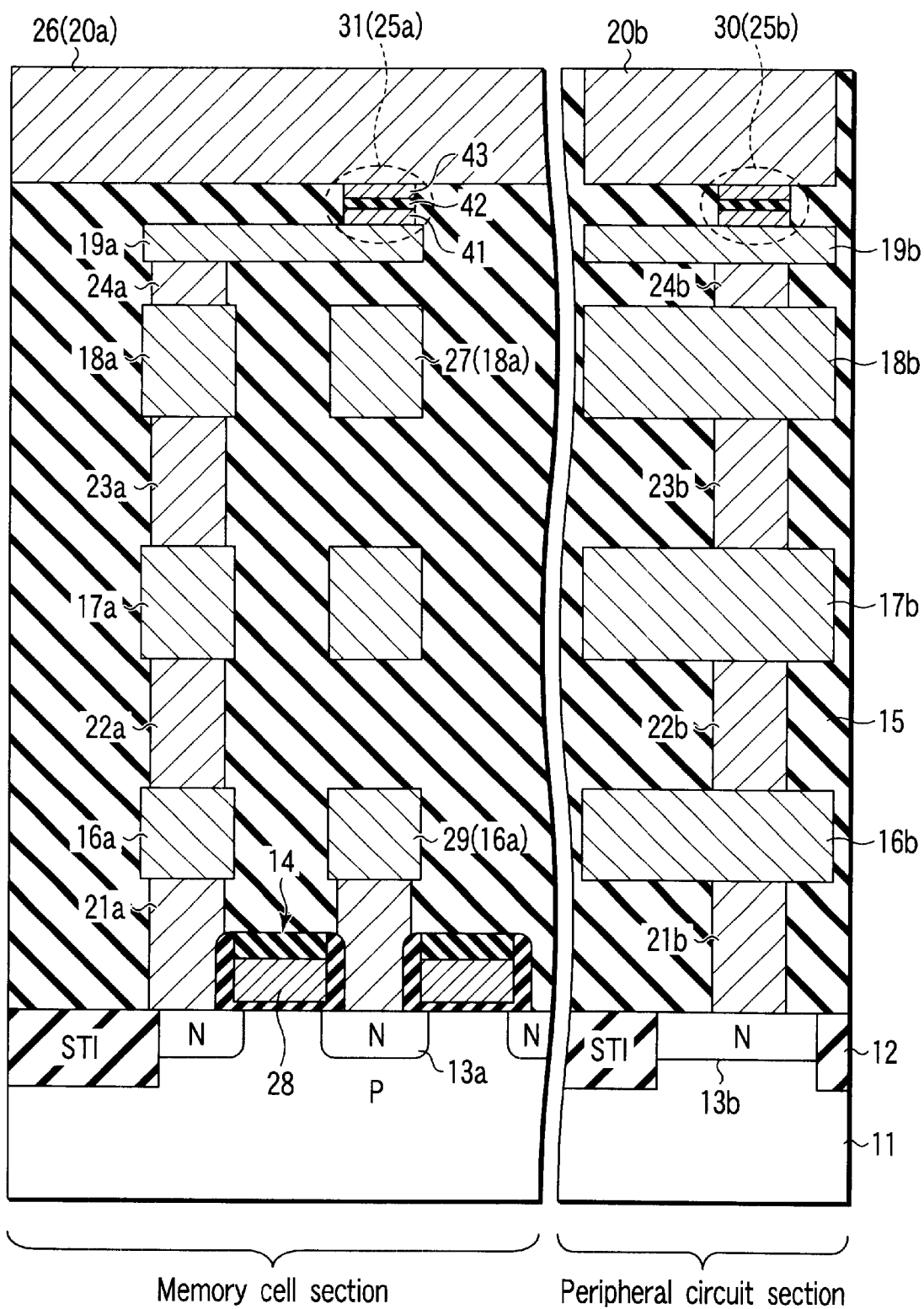
F I G. 1

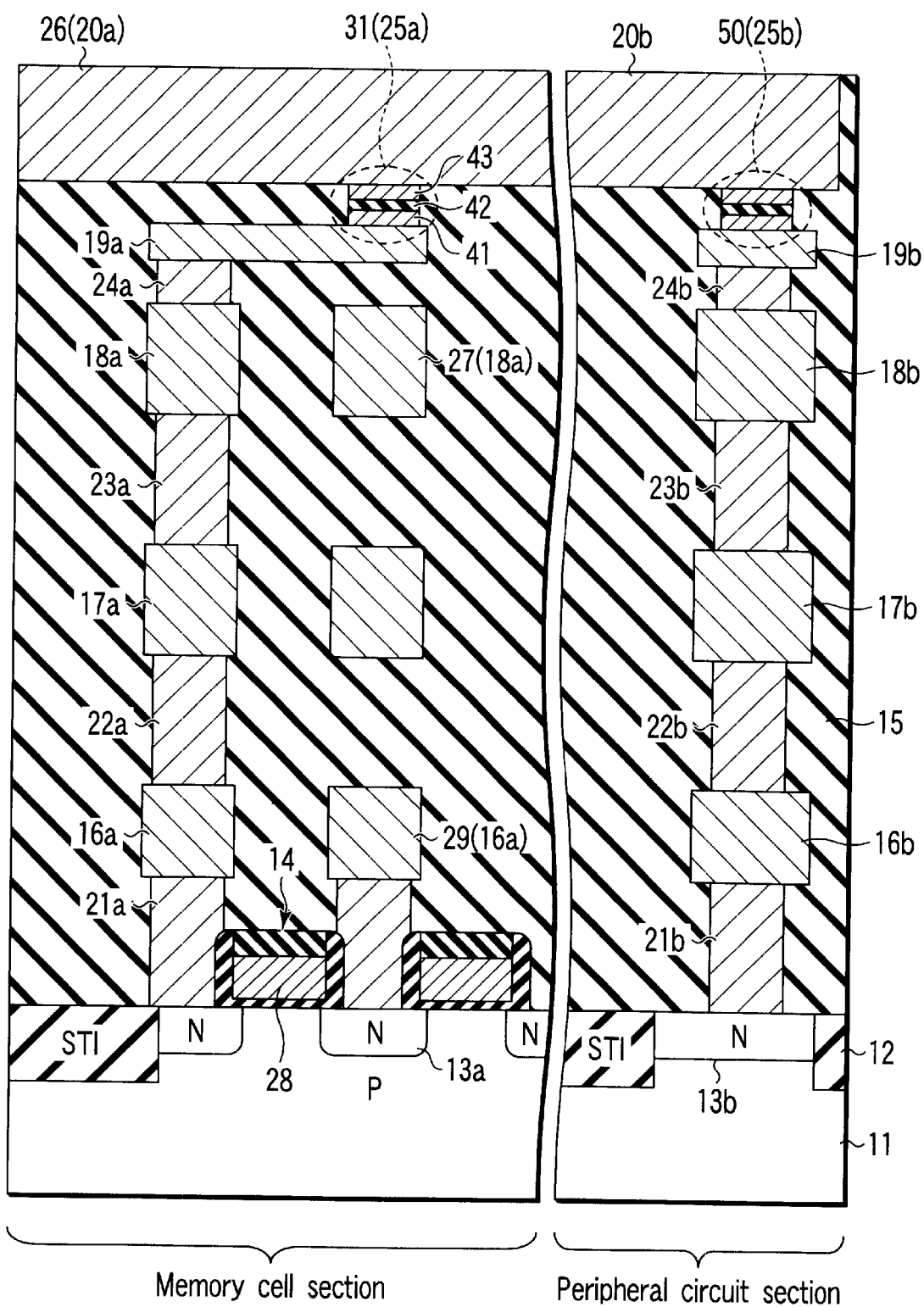
F I G. 8

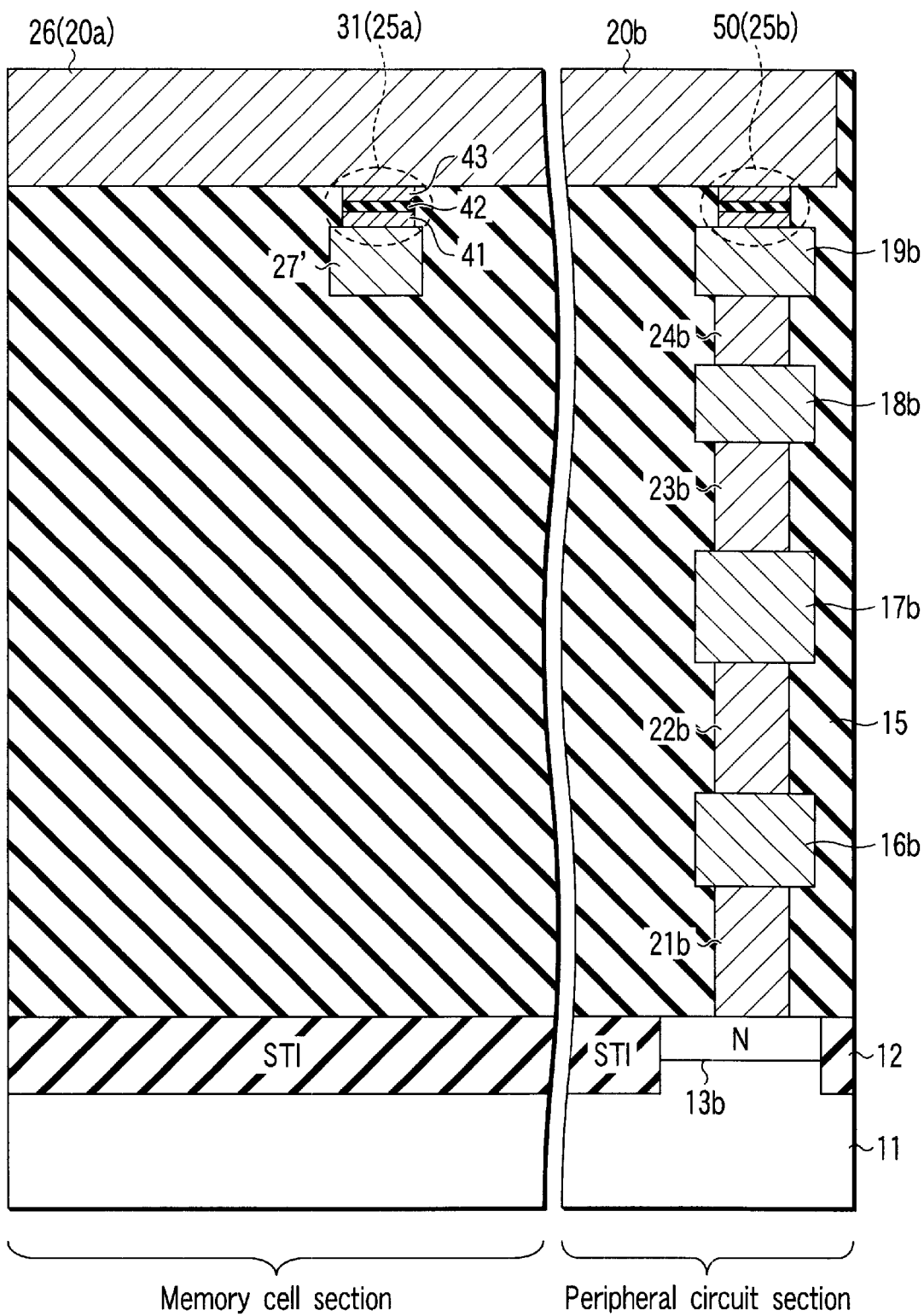
F I G. 16

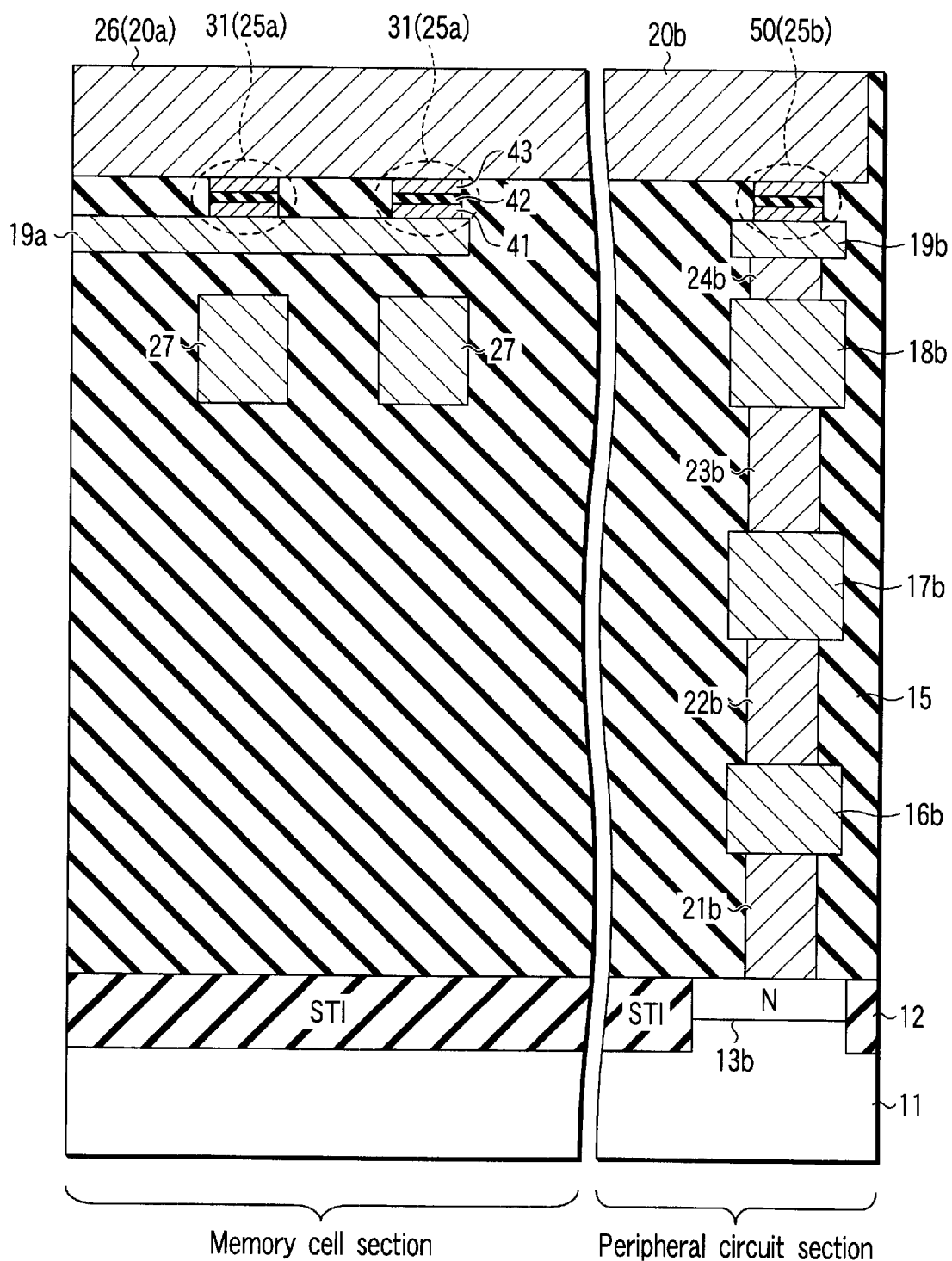
F I G. 19

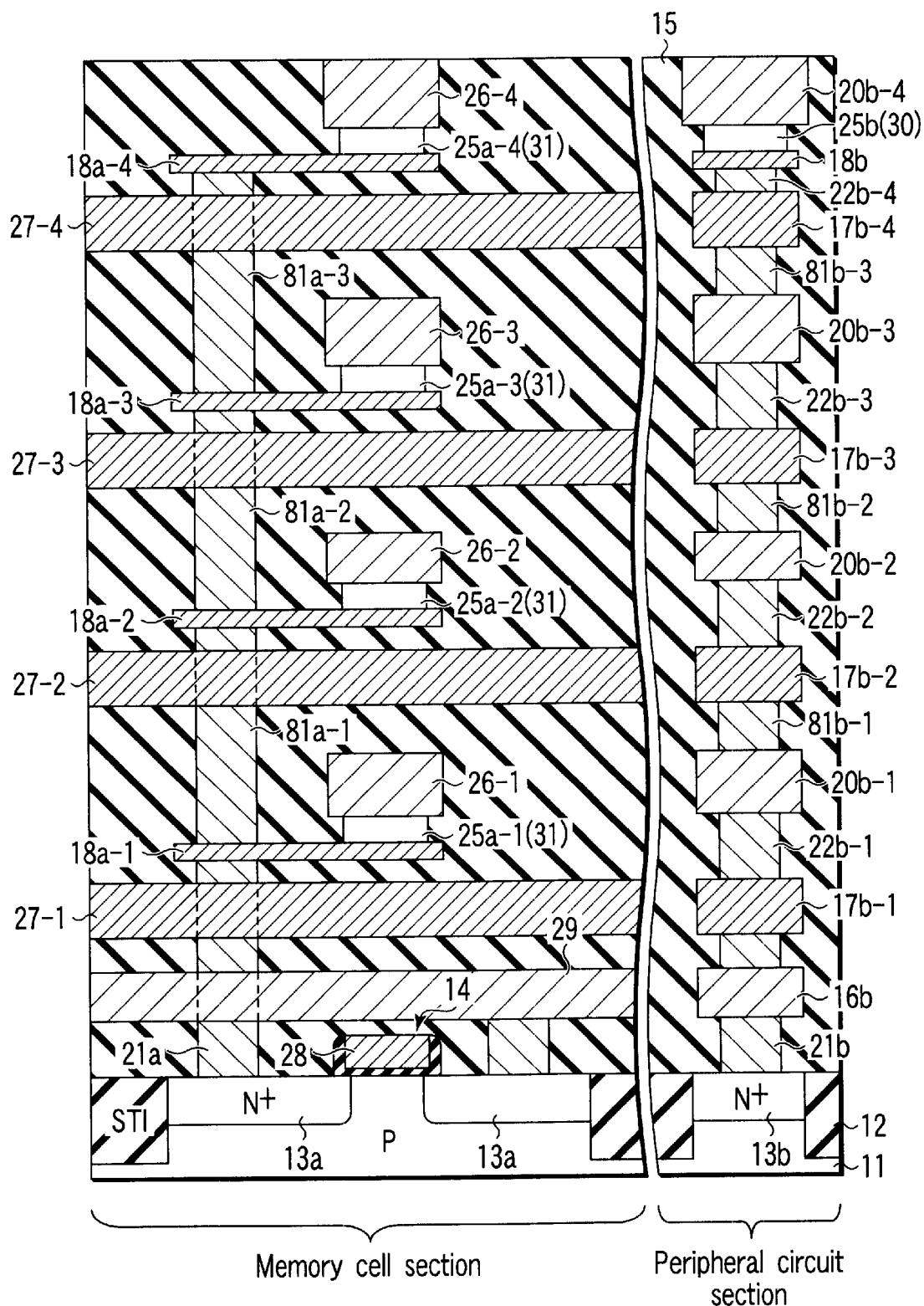
F I G. 30

SEMICONDUCTOR MEMORY DEVICE USING MAGNETO RESISTIVE EFFECT ELEMENT

CROSS-REFERENCE TO RELATED APPLICATIONS

This application is based upon and claims the benefit of priority from the prior Japanese Patent Applications No. 2001-096682, filed Mar. 29, 2001; and No. 2002-037327, filed Feb. 14, 2002, the entire contents of both of which are incorporated herein by reference.

BACKGROUND OF THE INVENTION

1. Field of the Invention

The present invention relates to a semiconductor memory device, and in particular, to a magnetic random access memory (MRAM) which uses a tunneling magneto resistive (TMR) element as a memory element.

2. Description of the Related Art

In recent years, MRAM (Magnetic Random Access Memory) memory cells, which use a tunneling magneto resistive (hereinafter abbreviated as TMR) effect, have been proposed as information memory elements.

FIG. 33 shows an equivalent circuit diagram of a semiconductor memory device in accordance with the prior art. FIG. 34 shows a schematic cross-sectional view of a TMR element.

As shown in FIG. 33, a bit line 26 and word lines 27 and 28 are disposed so as to be perpendicular to each other, and a TMR element 25 is disposed at the intersection of, among these, the bit line 26 and the write word line 27. One end portion of the TMR element 25 is connected to the bit line 26, and the another end portion is connected to a transistor 14. Further, a gate electrode of the transistor 14 is the read word line 28.

This TMR element 25 is a three-layer structure which is structured from two magnetic layers and a non-magnetic layer which is sandwiched by the magnetic layers. Namely, as shown in FIG. 34, the TMR element 25 is structured by a magnetization fixing layer 41 which is connected to a lower portion electrode 19a, a magnetic recording layer 43 which is connected to the bit line 26 via an upper electrode (not shown), and a thin tunnel junction layer 42 which is sandwiched by the magnetization fixing layer 41 and the magnetic recording layer 43.

Here, the magnetization fixing layer 41 is structured by an anti-ferromagnetic layer and a ferromagnetic layer, and is called a pin layer because the magnetization is fixed in one direction. On the other hand, the magnetic recording layer 43 is structured by a ferromagnetic layer, and is called a memory layer because the direction of magnetization can be freely changed and information is stored. The direction of magnetization of the magnetic recording layer 43 can be changed by a synthetic magnetic field formed by an electric current which flows in the bit line 26 and an electric current which flows in the write word line 27.

FIG. 35 and FIG. 36 show cross-sectional views of a semiconductor memory device in accordance with the prior art. The laminated-structure semiconductor memory device shown in FIG. 35 and FIG. 36 comprises a memory cell section and a peripheral circuit section disposed at the periphery of the memory cell section.

At the memory cell section, an element isolation region 12 having an STI (Shallow Trench Isolation) structure, and, for example, an N-type diffusion layer 13a are selectively formed, for example, in a P-type semiconductor substrate (or well) 11. A MOSFET 14 is selectively formed on the semiconductor substrate 11. First to fifth wirings 16a, 17a, 18a, 19a and 20a are formed in an insulating film 15 on the semiconductor substrate 11. Further, the diffusion layer 13a and the first wiring 16a are connected at a first contact 21a, the first wiring 16a and the second wiring 17a are connected at a second contact 22a, the second wiring 17a and the third wiring 18a are connected at a third contact 23a, and the third wiring 18a and the fourth wiring 19a are connected at a fourth contact 24a. Further, the fourth wiring 19a and the fifth wiring 20a are connected at the TMR element 25. The TMR element 25 is structured by the magnetization fixing layer (magnetic layer) 41, the tunnel junction layer (nonmagnetic layer) 42, and the magnetic recording layer (magnetic layer) 43.

Further, the fifth wiring 20a connected to the TMR element 25 is the bit line 26. The third wiring 18a which is not connected to the fourth wiring 19a is the write word line 27, and the write word line 27 is disposed so as to be orthogonal to the bit line 26. The TMR element 25 disposed at the intersection of the bit line 26 and the write word line 27 is used as a memory element. The MOSFET 14 electrically connected to the TMR element 25 functions as a switching element, and the gate electrode of the MOSFET 14 is the write word line 28. The first wiring 16a which is not connected to the second wiring 17a is a Gnd (ground) line 29.

Operations of writing/reading information in such a memory cell will be simply described.

First, when data "1", "0" are written in the TMR element 25, a pair of the write word line 27 and the bit line 26 are selected, and electric current is made to flow to both of the write word line 27 and the bit line 26 which are selected, and current magnetic fields are respectively generated. In accordance with this, only the magnetic field which is applied to the selected cell positioned at the cross point portion of the write word line 27 and the bit line 26 exceeds an inversion threshold value of magnetization of the TMR element 25, and information is written.

At this time, for example, when the directions of magnetization of the magnetization fixing layer 41 and the magnetic recording layer 43 are parallel, the tunnel resistance detected by making electric current flow to the tunnel junction layer 42 is the lowest, and in this state, for example, "1" can be stored. On the other hand, when the directions of magnetization of the magnetization fixing layer 41 and the magnetic recording layer 43 are anti-parallel, the tunnel resistance detected by making electric current flow to the tunnel junction layer 42 is the highest, and in this state, for example, "0" can be stored. Namely, in an MRAM, the difference of the tunnel resistances is stored as data "1", "0".

On the other hand, when the data "1", "0" which are written in the TMR element 25 are read out, when the read word line 28 and the bit line 26 are selected, electric current flows to the Gnd line 19 through the TMR element 25 and the MOSFET 14 from the bit line 26, and a determination of the data "1", "0" is carried out by the peripheral circuit reading out, as information, the difference of the tunnel resistances between the different TMR elements 25.

In the conventional semiconductor memory device having a memory cell section as described above, the peripheral circuit section is provided at the periphery of the memory cell section in order to control the memory cell. The peripheral circuit section will be described hereinafter.

FIG. 35 is an example in which a resistive element is provided at the peripheral circuit section. As shown in FIG. 35, a diffusion layer 32b is connected to wirings 16b via contacts 21b. Here, the diffusion layer 32b in the peripheral circuit section functions as a resistive element 30. The resistance value of the resistive element 30 is improved by enlarging the surface area of the diffusion layer 32b. However, in this case, the chip area becomes large due to the enlargement of the surface area of the diffusion layer 32b. Therefore, it is difficult to aim for miniaturization of the chips.

FIG. 36 is an example in which a fuse element is provided at the peripheral circuit section. As shown in FIG. 36, a diffusion layer 13b is connected to the first wiring 16b via the first contact 21b, and the first wirings 16b are connected to a second wiring 17b via second contacts 22b. The second wiring 17b is connected to a latch circuit (not shown). These wirings and contacts of the peripheral circuit section function as a fuse element 50. In this way, the conventional fuse element 50 is formed in a pattern different from that of the memory cell section. In such a conventional art, accompanying the miniaturization of elements, it has been desired to reduce the area occupied by the fuse element 50 with respect to the chip area.

BRIEF SUMMARY OF THE INVENTION

A semiconductor memory device according to one aspect of the present invention comprises a memory cell section and a peripheral circuit section disposed at a periphery of the memory cell section, the memory cell section comprising a first wiring which is extended in a first direction, a second wiring which is disposed above the first wiring and is extended in a second direction different from the first direction, a third wiring which is disposed between the first and second wirings, and a first magneto resistive effect element which is disposed at an intersection of the first and second wirings between the first and second wirings, and is connected to the second and third wirings, and the peripheral circuit section comprising a fourth wiring, a fifth wiring which is disposed above the fourth wiring, and a second magneto resistive effect element which is disposed between the fourth and fifth wirings and is connected to the fourth and fifth wirings to be used as any of a resistive element, a fuse element, and a contact.

BRIEF DESCRIPTION OF THE SEVERAL VIEWS OF THE DRAWING

FIG. 1 is a cross-sectional view showing a semiconductor memory device according to a first embodiment of the present invention.

FIG. 8 is a cross-sectional view showing a semiconductor memory device according to a second embodiment of the present invention.

FIG. 16 is a cross-sectional view showing the semiconductor memory device according to the fifth embodiment of the present invention, and in which the memory cell section of the second embodiment is modified.

FIG. 19 is a cross-sectional view showing the semiconductor memory device according to the sixth embodiment of the present invention, and in which the memory cell section of the second embodiment is modified.

FIG. 30 is a cross-sectional view showing a semiconductor memory device according to a modified example of the ninth embodiment of the present invention, and in which the memory cell section of the first embodiment is modified.

DETAILED DESCRIPTION OF THE INVENTION

Figure 2:
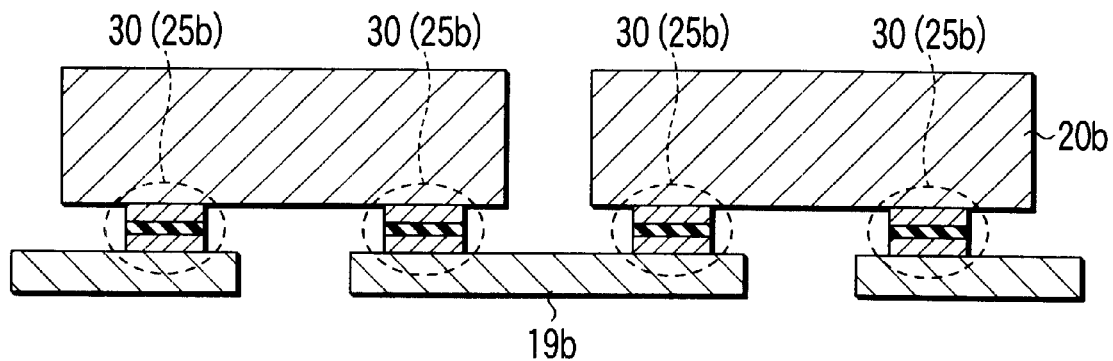
FIG. 2 is a cross-sectional view showing the semiconductor memory device according to the first embodiment of the present invention, in a case where TMR elements are connected in series.

The present invention relates to a magnetic random access memory (MRAM) which uses, for example, a tunneling magneto resistive (TMR) effect element as a memory element. In the MRAM, a memory cell array, in which a plurality of memory cells having TMR elements are disposed in a matrix form, is formed. Peripheral circuits, such as decoders, sense circuits and the like, are provided at the periphery of the memory cell array. Operations of writing/reading information are made possible by randomly accessing arbitrary cells.

Hereinafter, embodiments of the present invention will be described with reference to the figures. In this description, throughout all of the figures, common parts are denoted by common reference numerals.

[First Embodiment]

In the first embodiment, TMR elements are used as memory elements in a memory cell section, and TMR elements are used as resistive elements in a peripheral circuit section.

Figure 3:
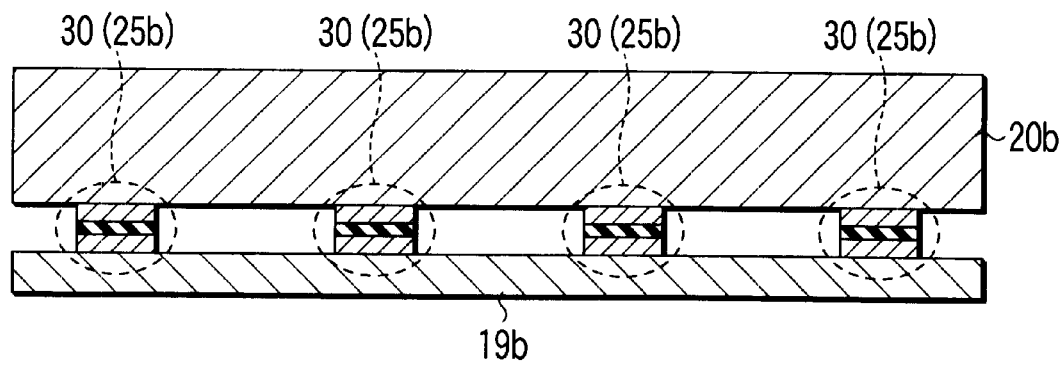
FIG. 3 is a cross-sectional view showing the semiconductor memory device according to the first embodiment of the present invention, in a case where the TMR elements are connected in parallel.

FIG. 1 shows a cross-sectional view of a semiconductor memory device according to the first embodiment of the present invention. FIG. 2 shows a partial cross-sectional view of the semiconductor memory device in a case where the TMR elements are connected in series in the peripheral circuit section. FIG. 3 shows a partial cross-sectional view of the semiconductor memory device in a case where the TMR elements are connected in parallel in the peripheral circuit section.

As shown in FIG. 1, for example, an element isolation region 12 having an STI (Shallow Trench Isolation) structure, and, for example, N-type diffusion layers 13a, 13b are selectively formed in a P-type semiconductor substrate (or well) 11. MOSFETs 14 are selectively formed on the semiconductor substrate 11. First to fifth wirings 16a, 16b, 17a, 17b, 18a, 18b, 19a, 19b, 20a, and 20b are formed in an insulating film 15 on the semiconductor substrate 11. Further, the diffusion layers 13a, 13b and the first wirings 16a, 16b are connected at first contacts 21a, 21b, the first wirings 16a, 16b and the second wirings 17a, 17b are connected at second contacts 22a, 22b, the second wirings 17a, 17b and the third wirings 18a, 18b are connected at third contacts 23a, 23b, and the third wirings 18a, 18b and the fourth wirings 19a, 19b are connected at fourth contacts 24a, 24b. Further, the fourth wirings 19a, 19b and the fifth wirings 20a, 20b are connected at TMR elements 25a, 25b. The TMR elements 25a, 25b each are structured from a magnetization fixing layer (magnetic layer) 41, a tunnel junction layer (non-magnetic layer) 42, and a magnetic recording layer (magnetic layer) 43.

A semiconductor memory device having such a laminated structure comprises a memory cell section and a peripheral circuit section which controls the memory cell section.

In the memory cell section, the TMR element 25a is used as a memory element 31 which stores data "1" or "0". The fifth wiring 20a connected to the TMR element 25a is a bit line 26. Further, the third wiring 18a which is not connected to the fourth wiring 19a is a write word line 27, and the write word line 27 is disposed, for example, so as to be orthogonal to the bit line 26. The MOSFET 14 which is electrically connected to the TMR element 25a functions as a switching element for reading data, and a gate electrode of the MOSFET 14 is a read word line 28. The first wiring 16a which is not connected to the second wiring 17a is a Gnd (ground) line 29.

In the peripheral circuit section, the TMR element 25b which connects the fourth wiring 19b and the fifth wiring 20b is used as a resistive element 30. The resistance of the resistive element 30 can be adjusted by the following method for example.

As shown in FIG. 2 and FIG. 3, when a value of resistance of the resistive element 30 is to be varied, it suffices to change the arrangement of the TMR elements 25b. Namely, when the TMR elements 25b are connected in series (FIG. 2), by changing the number of the TMR elements 25b, the resistive element 30 can obtain an arbitrary high value of resistance. Further, when the TMR elements 25b are connected in parallel (FIG. 3), dispersion in the values of resistance due to dispersion in the machined dimensions thereof can be averaged, and highly precise resistive elements 30 can be realized.

Further, the resistance of the resistive element 30 can be adjusted by a film thickness of the tunnel junction layer 42 which forms a part of the TMR element 25b.

Further, the resistance of the resistive element 30 can be adjusted by making the directions of the magnetization of the magnetic layers 41, 43 of the TMR element 25b parallel or anti-parallel. Here, "parallel" means a state in which the directions of magnetization of the magnetic layers 41, 43 are oriented in the same direction, and "anti-parallel" means a state in which the directions of magnetization of the magnetic layers 41, 43 are oriented in opposite directions.

In this way, the TMR elements 25a, 25b which are used as the memory element 31 or the resistive element 30 have a single tunnel junction structure or a double tunnel junction structure which are shown hereinafter, and may have either structure.

Figure 4A:
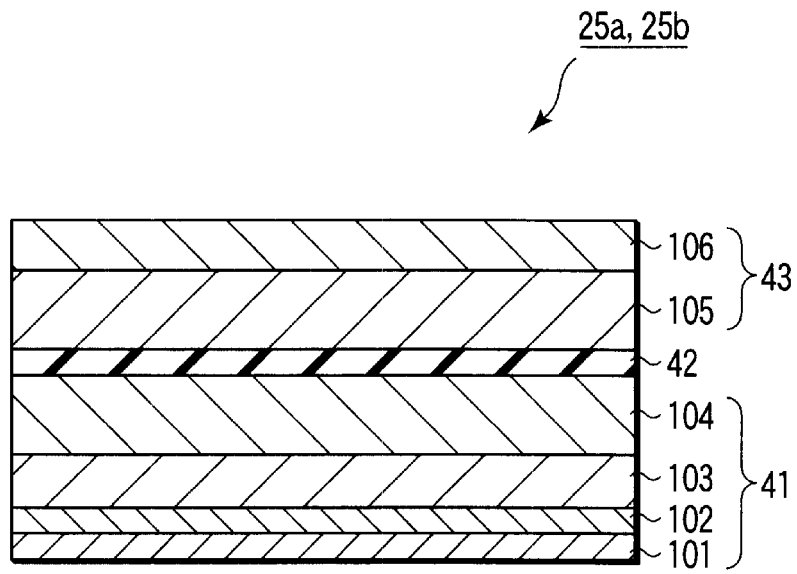
FIGS. 4A and 4B are cross-sectional views showing a TMR element having a single tunnel junction structure according to the respective embodiments of the present invention.
Figure 4B:
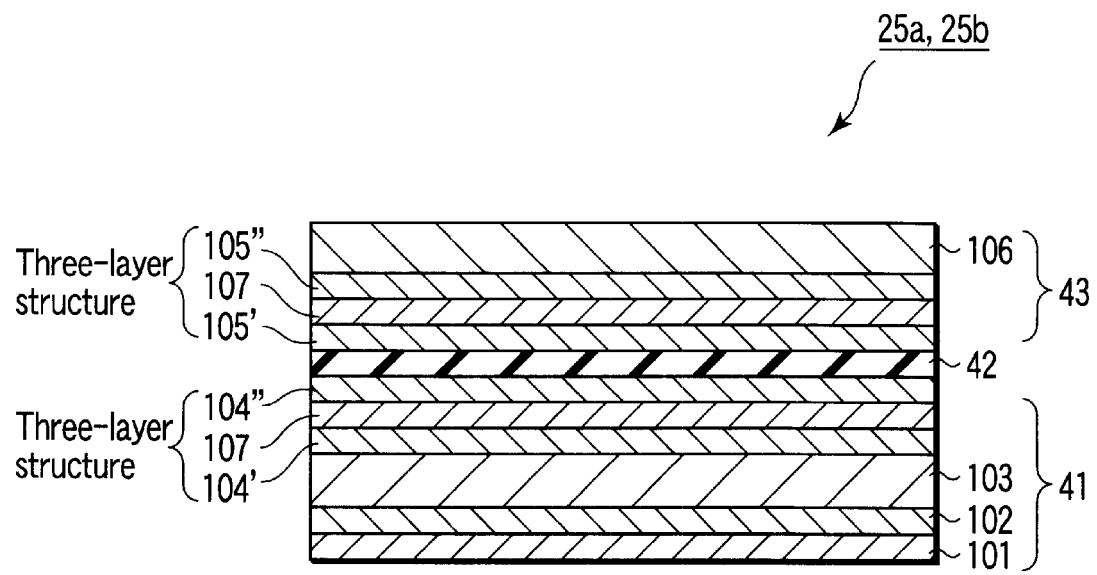

FIG. 4A and FIG. 4B show cross-sectional views of a TMR element having a single tunnel junction structure. Hereinafter, the structures of the TMR elements 25a, 25b having a single tunnel junction structure will be described.

The TMR elements 25a, 25b shown in FIG. 4A are each formed from the magnetization fixing layer 41 in which a template layer 101, an initial ferromagnetic layer 102, an antiferromagnetic layer 103, and a reference ferromagnetic layer 104 are layered in order; the tunnel junction layer 42 which is formed on the magnetization fixing layer 41; and the magnetic recording layer 43 in which a free ferromagnetic layer 105 and a contact layer 106 are layered in order on the tunnel junction layer 42.

In the same way, the TMR elements 25a, 25b shown in FIG. 4B are each formed from the magnetization fixing layer 41 in which the template layer 101, the initial ferromagnetic layer 102, the antiferromagnetic layer 103, a ferromagnetic layer 104', a non-magnetic layer 107, and a ferromagnetic layer 104" are layered in order; the tunnel junction layer 42 which is formed on the magnetization fixing layer 41; and the magnetic recording layer 43 in which a ferromagnetic layer 105', the non-magnetic layer 107, a ferromagnetic layer 105", and the contact layer 106 are layered in order on the tunnel junction layer 42.

Note that, at the TMR elements 25a, 25b shown in FIG. 4B, by introducing the three-layer structure formed from the ferromagnetic layer 104', the non-magnetic layer 107, and the ferromagnetic layer 104" in the magnetization fixing layer 41, and the three-layer structure formed from the ferromagnetic layer 105', the non-magnetic layer 107, and the ferromagnetic layer 105" in the magnetic recording layer 43, generation of a magnetic pole at the ferromagnetic interior is suppressed and a cell structure which is suitable for miniaturizing can be provided more than at the TMR elements 25a, 25b shown in FIG. 4A.

Figure 5A:
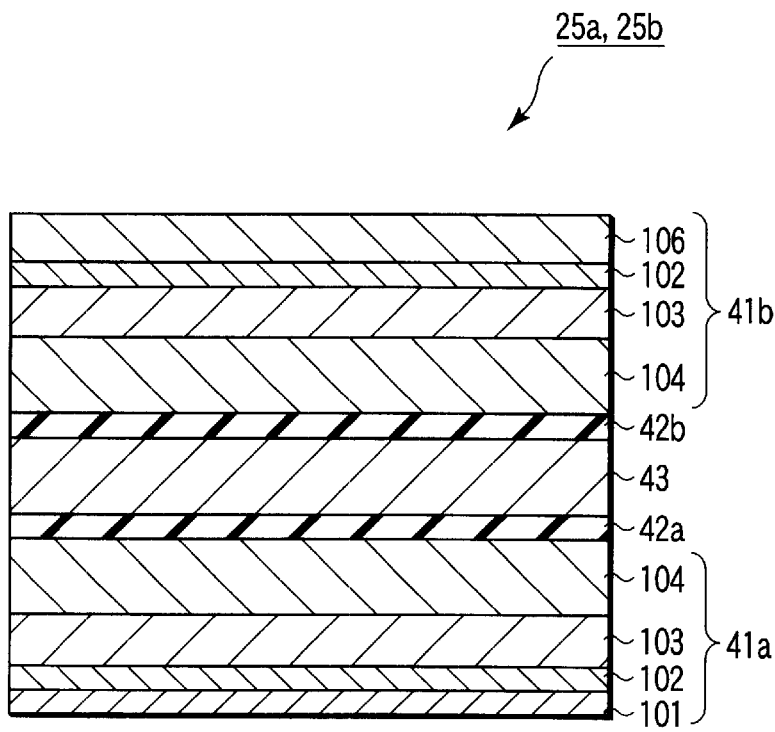
FIGS. 5A and 5B are cross-sectional views showing a TMR element having a double tunnel junction structure according to the respective embodiments of the present invention.
Figure 5B:
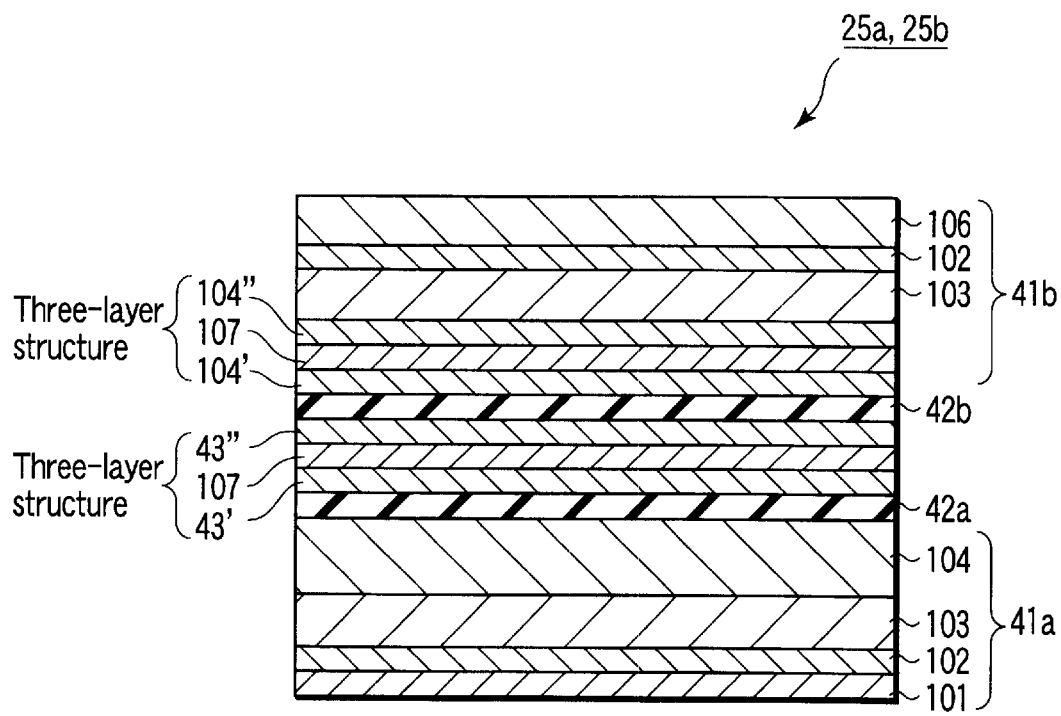

FIG. 5A and FIG. 5B show cross-sectional views of TMR elements having a double tunnel junction structure. Hereinafter, the structures of the TMR elements 25a, 25b having a double tunnel junction structure will be described.

The TMR elements 25a, 25b shown in FIG. 5A are formed from a first magnetization fixing layer 41a in which the template layer 101, the initial ferromagnetic layer 102, the antiferromagnetic layer 103, and the reference ferromagnetic layer 104 are layered in order; a first tunnel junction layer 42a formed on the first magnetization fixing layer 41a; the magnetic recording layer 43 formed on the first tunnel junction layer 42a; a second tunnel junction layer 42b formed on the magnetic recording layer 43; and a second magnetization fixing layer 41b in which the reference ferromagnetic layer 104, the antiferromagnetic layer 103, the initial ferromagnetic layer 102, and the contact layer 106 are layered in order on the second tunnel junction layer 42b.

The TMR elements 25a, 25b shown in FIG. 5B are formed from the first magnetization fixing layer 41a in which the template layer 101, the initial ferromagnetic layer 102, the antiferromagnetic layer 103, and the reference ferromagnetic layer 104 are layered in order; the first tunnel junction layer 42a formed on the first magnetization fixing layer 41a; the magnetic recording layer 43 in which a ferromagnetic layer 43', the non-magnetic layer 107, and a ferromagnetic layer 43" are layered in order in a three-layer structure on the first tunnel junction layer 42a; the second tunnel junction layer 42b formed on the magnetic recording layer 43; and the second magnetization fixing layer 41b in which the ferromagnetic layer 104', the non-magnetic layer 107, the ferromagnetic layer 104", the antiferromagnetic layer 103, the initial ferromagnetic layer 102, and the contact layer 106 are layered in order on the second tunnel junction layer 42b.

Note that, at the TMR elements 25a, 25b shown in FIG. 5B, by introducing the three-layer structure which is formed from the ferromagnetic layer 43' the nonmagnetic layer 107, and the ferromagnetic layer 43" and which forms the magnetic recording layer 43, and the three-layer structure formed from the ferromagnetic layer 104', the non-magnetic layer 107, and the ferromagnetic layer 104" in the second magnetization fixing layer 41b, generation of a magnetic pole at the ferromagnetic interior is suppressed and a cell structure which is suitable for miniaturizing can be provided more than at the TMR elements 25a, 25b shown in FIG. 5A.

By using the TMR elements 25a, 25b having such a double tunnel junction structure, as compared with the case where the TMR elements 25a, 25b having a single tunnel junction structure are used, deterioration of the MR (Magneto Resistive) ratio (the rate of change of the resistances of the "1" state, "0" state) at the time of applying the same external bias is small, and it is possible to operate at a higher bias. Namely, it is advantageous at the time of reading information in the cells out to an external portion.

The TMR elements 25a, 25b having such a single tunnel junction structure or a double tunnel junction structure are formed by using the following materials.

For example, Fe, Co, Ni and alloys thereof, magnetite whose spin polarization ratio is large, oxides such as $CrO_2$, $RXMnO_{3-y}$ (R: rare earth; X: Ca, Ba, Sr), as well as Heusler's alloys such as NiMnSb, PtMnSb, and the like, are preferably used as the materials of the magnetization fixing layers 41, 41a, 41b and the magnetic recording layer 43. Further, non-magnetic elements such as Ag, Cu, Au, Al, Mg, Si, Bi, Ta, B, C, O, N, Pd, Pt, Zr, Ir, W, Mo, Nb, and the like may be slightly contained in these magnetic materials provided that the ferromagnetism does not deteriorate.

Fe—Mn, Pt—Mn, Pt—Cr—Mn, Ni—Mn, Ir—Mn, NiO, $Fe_2O_3$, and the like are preferably used as the material of the antiferromagnetic layer 103 which forms a part of the magnetization fixing layers 41, 41a and 41b.

Various dielectrics, such as $Al_2O_3$, $SiO_2$, MgO, AlN, $Bi_2O_3$, $MgF_2$, $CaF_2$, $SrTiO_2$, $AlLaO_3$, or the like, can be used as the materials of the tunnel junction layers 42, 42a and 42b. Oxygen, nitrogen, and fluorine deficiencies may exist in these dielectrics.

As described above, at the memory cell section, writing and reading of data in a case where the TMR element 25a is used as the memory element 31 are carried out as follows.

When data is written into the TMR element 25a, the bit line 26 and the write word line 27 are selected, and electric currents are made to respectively flow to the bit line 26 and write word line 27, and current magnetic fields are generated. A synthetic magnetic field of the current magnetic fields which are respectively generated at the bit line 26 and the write word line 27 is thereby applied to the TMR element 25a, and data of "1" or "0" is written into the TMR element 25a.

When the data written in the TMR element 25a is read, the MOSFET 14 connected to the TMR element 25a is turned on, and electric current is made to flow from the TMR element 25a to the diffusion layer 13a of the MOSFET 14. The value of resistance of the TMR element 25a is thereby read, and determination of data of "1" of "0" is carried out.

In accordance with the above-described first embodiment, the resistive element 30 of the peripheral circuit section is formed from the TMR element 25b disposed between wirings. Namely, the resistive element 30 of the peripheral circuit section is formed to have a similar structure as in the memory cell section. Accordingly, in comparison with the prior art in which the resistive elements are formed at the diffusion layer, the area occupied by the resistive elements 30 can be decreased, and therefore, it is possible to reduce the chip area.

Figure 6:
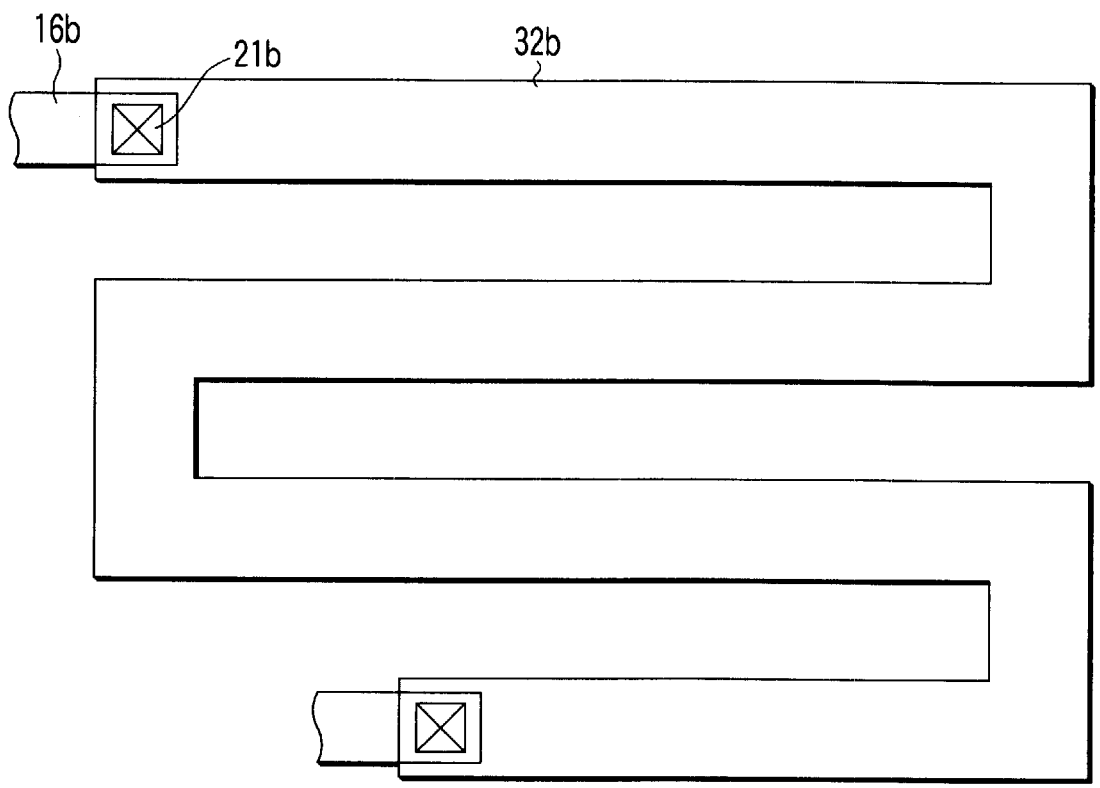
FIG. 6 is a plan view showing a semiconductor memory device in accordance with a prior art.
Figure 7:
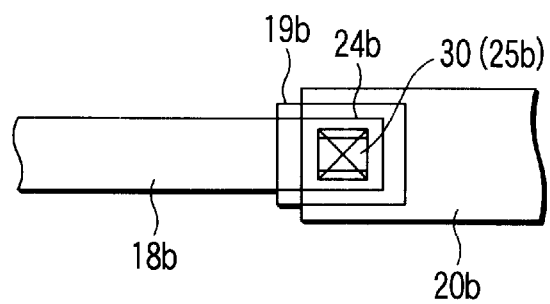
FIG. 7 is a plan view showing the semiconductor memory device according to the first embodiment of the present invention.

Concretely, as shown in FIG. 6, in the prior art in which the resistive element is formed from a diffusion layer 32b, the sheet resistance of the diffusion layer 32b is 250 Ω/sheet. Therefore, when a resistive element having a value of resistance of 10 kΩ is necessary, an area of 40 sheets is necessary. On the other hand, in the first embodiment, the value of resistance of the resistive element 30 does not change due to increases and decreases in the surface area of the TMR element 25b, and, for example, is determined by the value of resistance of the tunnel junction layer 42 or the like. Accordingly, as shown in FIG. 7, even when the resistive element 30 having a value of resistance of 10 kΩ is needed, if the value of resistance of the tunnel junction layer 42 is made to be 10 kΩ, it is possible to adjust the value of resistance without increasing the surface area of the TMR element 25b.

Further, if a plurality of TMR elements 25b in the peripheral circuit section are connected in series, it is possible to realize a high-resistance resistive element 30. On the other hand, if a plurality of TMR elements 25b in the peripheral section are connected in parallel, dispersion in the values of resistance can be suppressed, and it is possible to realize a highly precise resistive element 30.

[Second Embodiment]

In a second embodiment, TMR elements are used as memory elements in the memory cell section, and TMR elements are used as fuse elements in the peripheral circuit section.

FIG. 8 shows a cross-sectional view of a semiconductor memory device according to the second embodiment of the present invention. In the second embodiment, description of structures which are similar to those of the first embodiment is omitted, and only structures different from those of the first embodiment will be described.

In the same way as in the first embodiment, the multi-layer structure semiconductor memory device according to the second embodiment is formed from a memory cell section and a peripheral circuit section which controls the memory cell section.

In the peripheral circuit section, the TMR element 25b which connects the fourth wiring 19b and the fifth wiring 20b is used as a fuse element 50. In the method of using the TMR element 25b as the fuse element 50, the TMR element 25b is broken down by making heavy electric current of a predetermined value or more flow to the TMR element 25b. The resistance of the TMR element 25b thereby deteriorates, and electric current easily flows to the TMR element 25b. In this way, the fuse element 50 is used as an electric fuse in the redundancy circuit of the peripheral circuit section.

In accordance with the above-described second embodiment, the fuse element 50 in the peripheral circuit section is formed from the TMR element 25b disposed between the wirings. Namely, the fuse element 50 in the peripheral circuit section can be formed by a similar structure as in the memory cell section. Accordingly, in the second embodiment, as compared with the conventional art in which the fuse element 50 is formed by a structure different from that in the memory cell section, the area of the fuse element 50 can be decreased. Thus, the chip area can be reduced.

Figure 9:
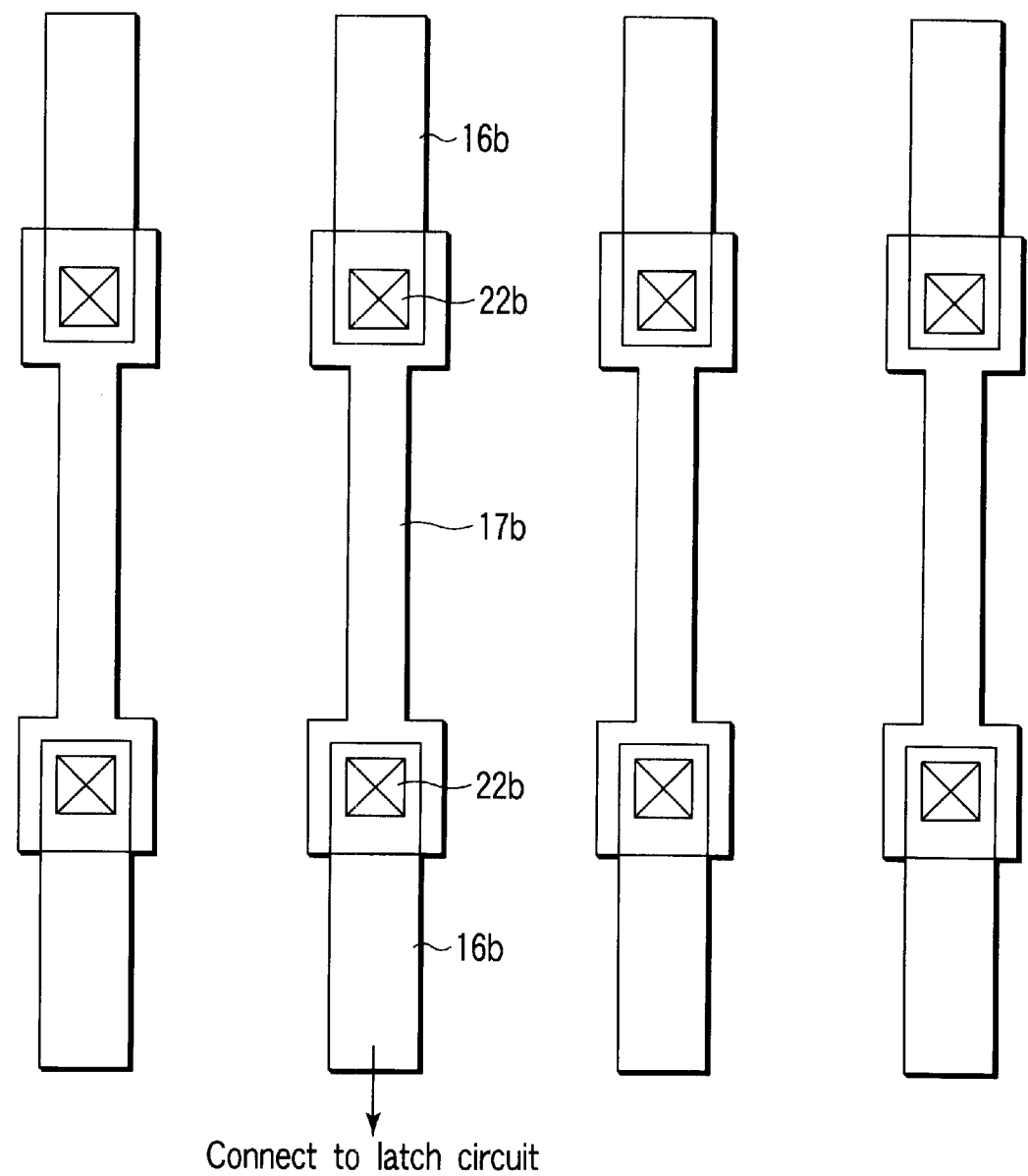
FIG. 9 is a plan view showing a semiconductor memory device in accordance with the prior art.
Figure 10:
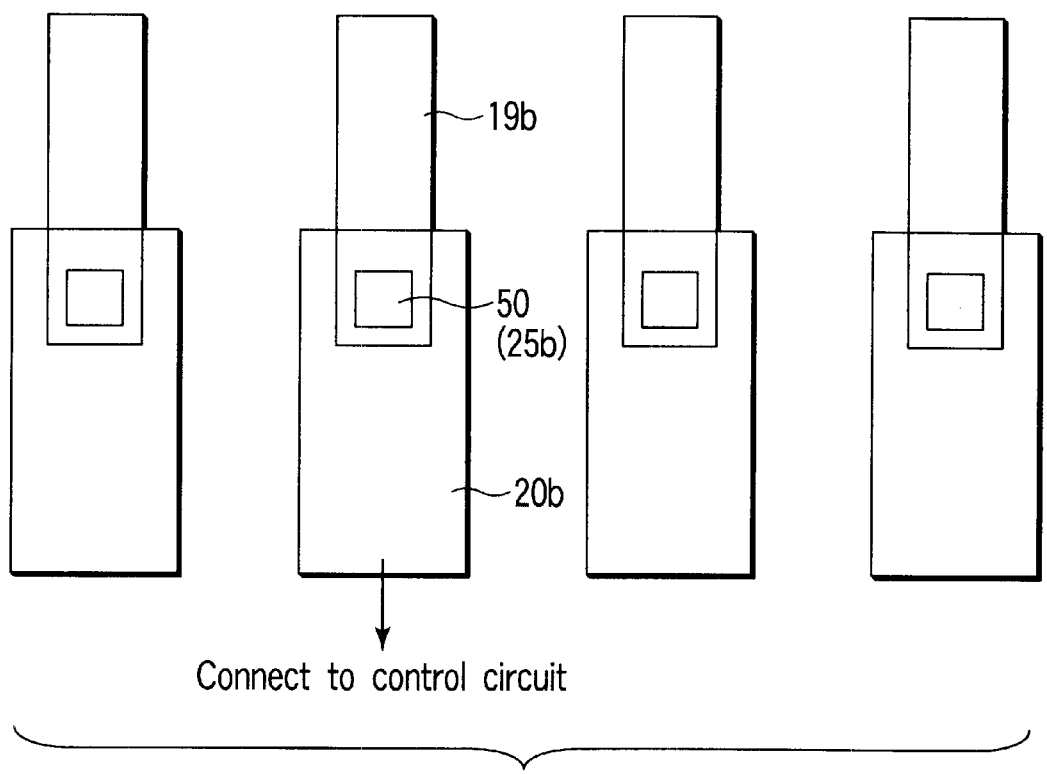
FIG. 10 is a cross-sectional view showing the semiconductor memory device according to the second embodiment of the present invention.

Concretely, as shown in FIG. 9, the first wiring 16b and the second wiring 17b are connected at a contact 22b, and the second wiring 17b is connected to the fuse latch circuit. Accordingly, a certain area of wiring has been necessary. In contrast, in the second embodiment, as shown in FIG. 10, the fuse element 50 is disposed between the fourth wiring 19b and the fifth wiring 20b, and the fifth wiring 20b can be connected to the control circuit. Accordingly, because the area of the wiring can be reduced more than in the conventional art, the chip area can be reduced.

[Third Embodiment]

In a third embodiment, TMR elements are used as memory elements in the memory cell section, TMR elements are used as contacts in the peripheral circuit section, and a capacitor is formed.

Figure 11:
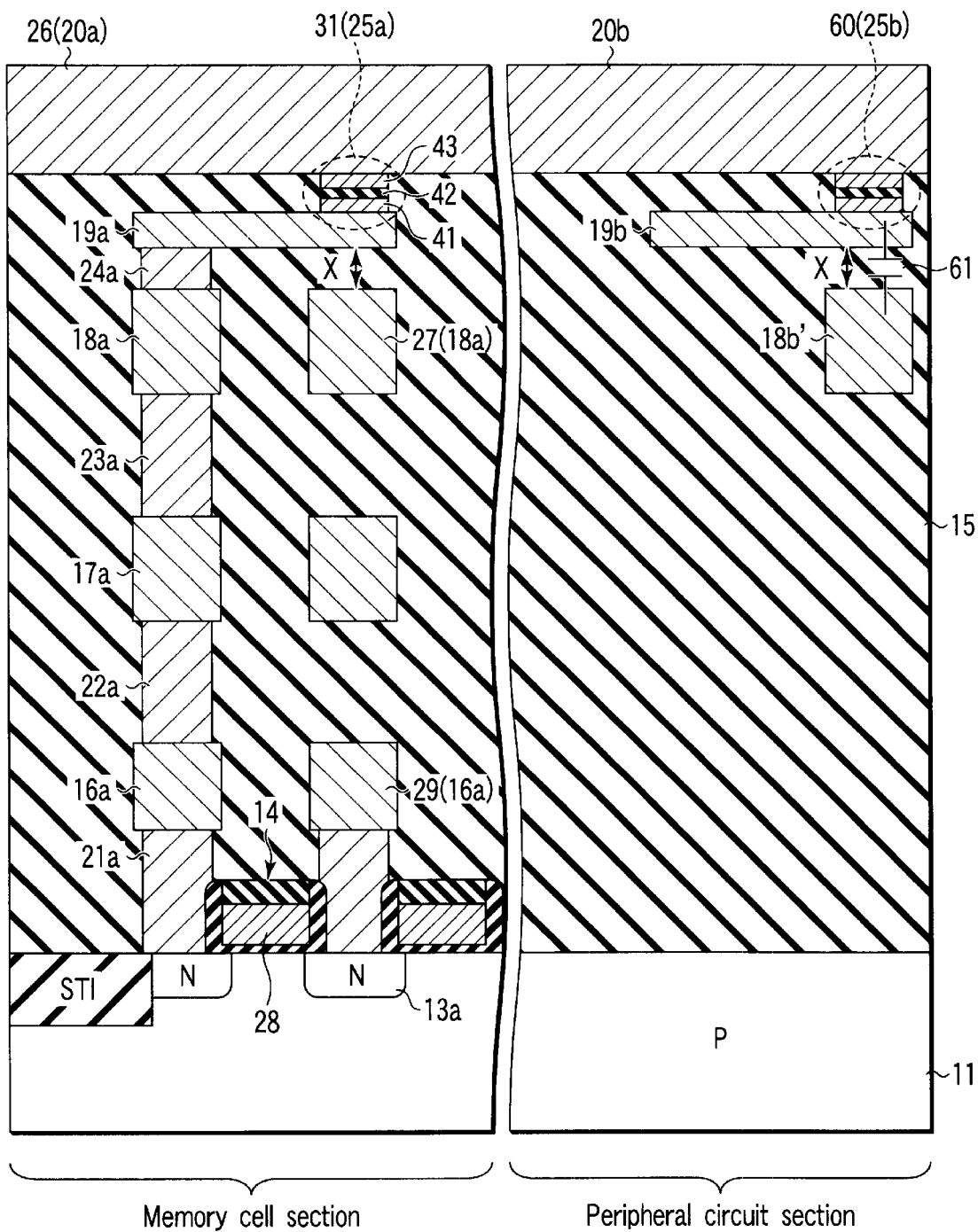
FIG. 11 is a cross-sectional view showing a semiconductor memory device according to a third embodiment of the present invention.

FIG. 11 shows a cross-sectional view of a semiconductor memory device according to the third embodiment of the present invention. In the third embodiment, a description of structures which are similar to those of the first embodiment is omitted, and only structures different from those of the first embodiment will be described.

In the same way as in the first embodiment, the multi-layer structure semiconductor memory device according to the third embodiment is formed from a memory cell section and a peripheral circuit section which controls the memory cell section.

In the memory cell section, because electric current at the time of generating a write magnetic field can be decreased by shortening a distance X between the fourth wiring 19a and the write word line 27, the margin of operation can be improved.

When a portion of the peripheral circuit section is formed to have the same structure as that of the memory cell section, the distance X between a third wiring 18b', which corresponds to the write word line 27 in the memory cell section, and the fourth wiring 19b is extremely short. Therefore, a capacitor 61 is formed by the third wiring 18b', the fourth wiring 19b and the insulating film 15 between these third and fourth wirings 18b', 19b. At this time, the TMR element 25b which connects the fourth wiring 19b and the fifth wiring 20b is used as a contact 60. Here, the fifth wiring 20b is connected to another circuit (not shown).

Note that the resistance of the TMR element 25b is generally about 1 KΩ·$\mu$m$^2$, but it is possible to lower the resistance to, for example, about 100 Ω·$\mu$m$^2$ or 10 Ω·$\mu$m$^2$. Therefore, it is possible to sufficiently utilize the TMR element 25b as a contact.

In accordance with the above-described third embodiment, the contact 60 in the peripheral circuit section is formed from the TMR element 25b disposed between the wirings. Namely, due to the memory cell section and the peripheral circuit section being formed to have similar structures, a wiring structure which is not wasteful can be realized as compared with a case where the memory cell section and the peripheral circuit section are formed to have different structures. Therefore, it is possible to reduce the chip area.

Moreover, by making the distance X between the fourth wiring 19a and the write word line 27 short and by forming the memory cell section and the peripheral circuit section to have similar structures, the capacitor 61 can be formed in the peripheral circuit section.

Note that, in the third embodiment, a structure in which the capacitor 61 is connected to another circuit (not shown) via the contact 60 and the fifth wiring 20*b* is shown. However, the third embodiment of the present invention is not limited to this structure. For example, the diffusion layer 13*a*, the first to third wirings 16*a*, 17*a* and 18*a*, and the first to fourth contacts 21*a*, 22*a*, 23*a* and 24*a* in the memory cell section are similarly formed in the peripheral circuit section as well, and the fourth contact 24*a* is connected to the fourth wiring 19*b*. The capacitor 61 may be thereby connected to the diffusion layer 13*a*. Note that, in this case, the capacitor 61 is formed so as to not be connected to the contact 60 and the fifth wiring 20*b*.

[Fourth Embodiment]

A fourth embodiment is an embodiment in which the structure of the memory cell section in the first to third embodiments described above is modified, and in which a diode is used as a switching element for reading data.

Figure 12:
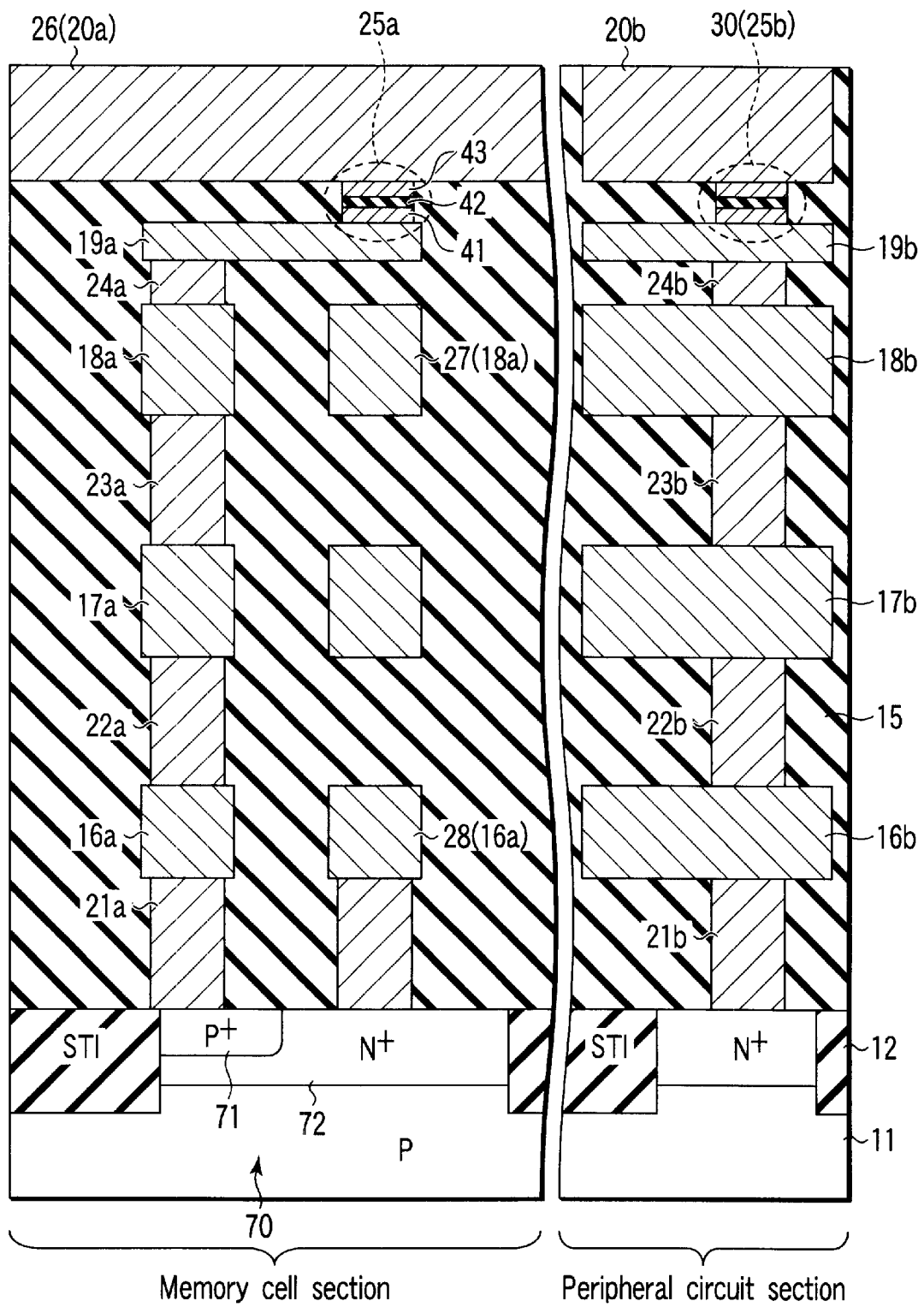
FIG. 12 is a cross-sectional view showing a semiconductor memory device according to a fourth embodiment of the present invention, and in which a memory cell section of the first embodiment is modified.
Figure 13:
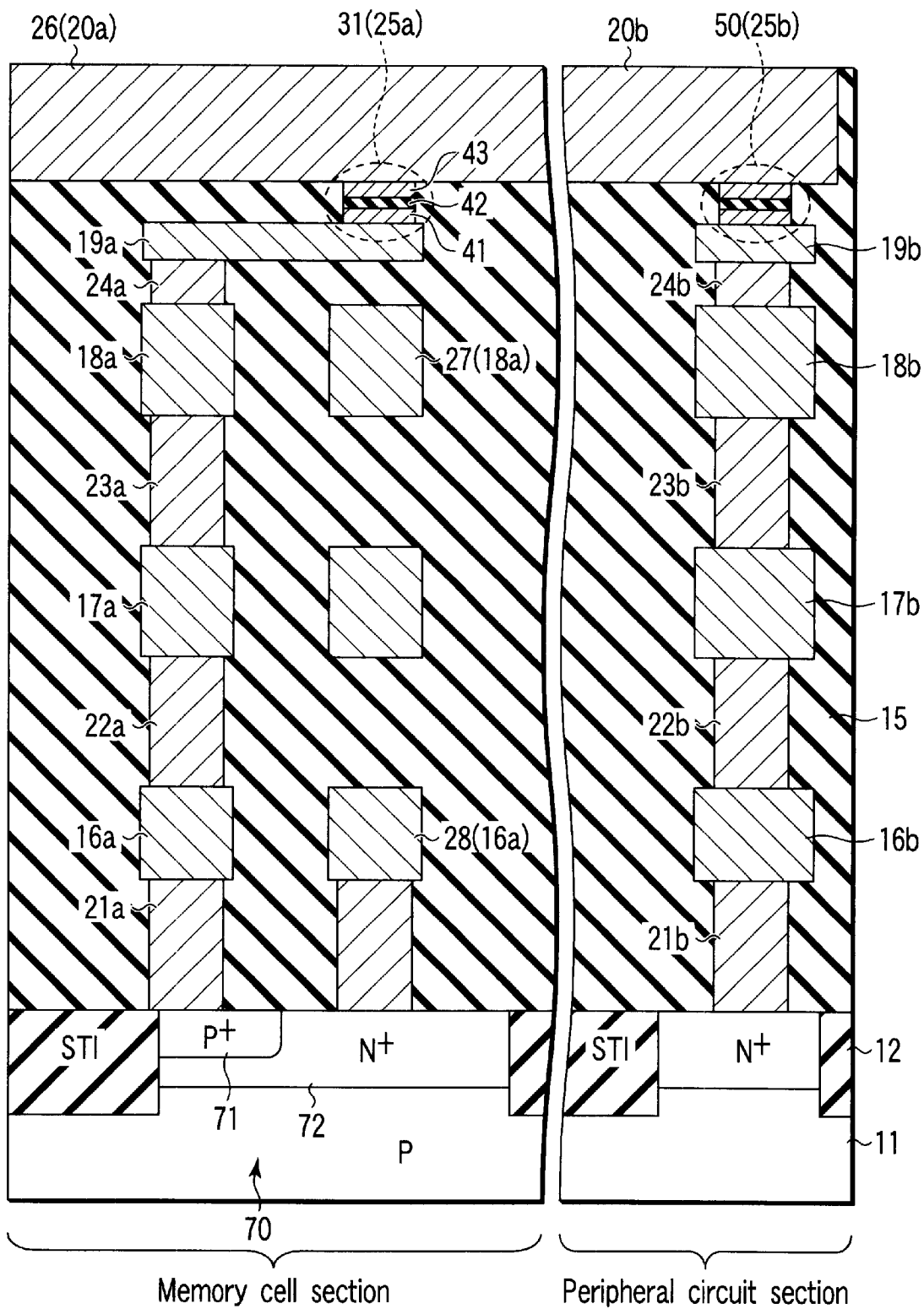
FIG. 13 is a cross-sectional view showing the semiconductor memory device according to the fourth embodiment of the present invention, and in which a memory cell section of the second embodiment is modified.
Figure 14:
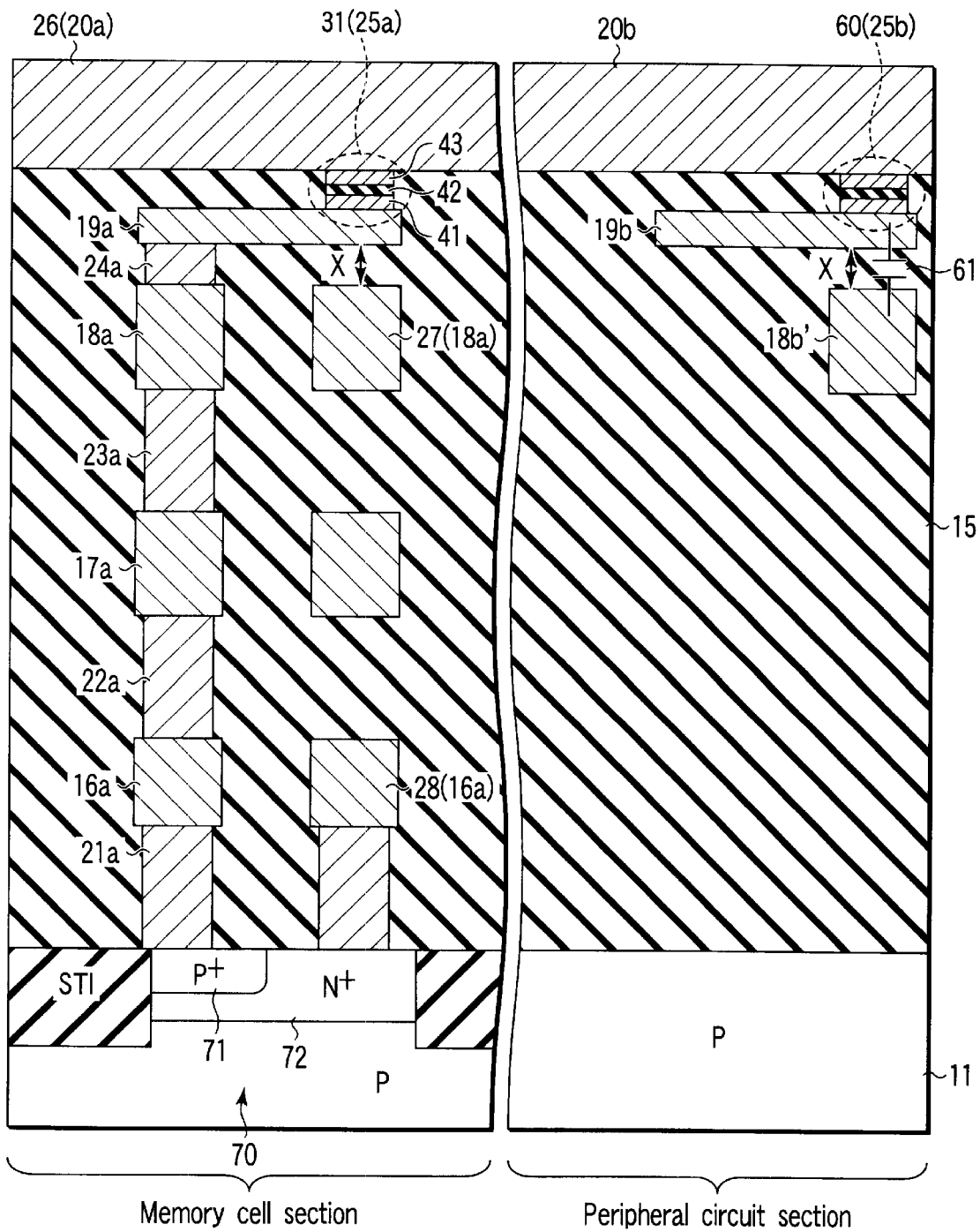
FIG. 14 is a cross-sectional view showing the semiconductor memory device according to the fourth embodiment of the present invention, and in which a memory cell section of the third embodiment is modified.

FIG. 12 to FIG. 14 show cross-sectional views of a semiconductor memory device according to the fourth embodiment of the present invention. In the fourth embodiment, structures which are similar to those of the first to third embodiments will be described simplistically.

In the memory cell section, a diode 70 comprising a P-type diffusion layer 71 and an N-type diffusion layer 72 is connected in series to the TMR element 25*a* used as the memory element 31. Further, the diode 70 functions as a switching element for reading.

Here, when the diode 70 is used as a switching element, data is written to the TMR element 25*a* in the same way as in the first embodiment. Further, reading of data written in the TMR element 25*a* is realized by adjusting the bias voltage such that electric current flows to the diode 70 connected to the TMR element 25*a*, and by reading the value of resistance of the TMR element 25*a*.

The structure of the peripheral circuit section is similar to those of the first to third embodiments. Namely, as shown in FIG. 12, the TMR element 25*b* which connects the fourth wiring 19*b* and the fifth wiring 20*b* is used as the resistive element 30. Further, as shown in FIG. 13, the TMR element 25*b* which connects the fourth wiring 19*b* and the fifth wiring 20*b* is used as the fuse element 50. Further, as shown in FIG. 14, the capacitor 61 is formed by the third wiring 18*b*', the fourth wiring 19*b*, and the insulating film 15 between these third and fourth wirings 18*b*', 19*b*. At this time, the TMR element 25*b* which connects the fourth wiring 19*b* and the fifth wiring 20*b* is used as the contact 60.

In accordance with the above-described fourth embodiment, effects which are similar to those of the first to third embodiments can be obtained.

Moreover, in the fourth embodiment, because the diode 70 is used as a switching element for reading, the area used exclusively for the memory cell section can be reduced more than in the first to third embodiments.

[Fifth Embodiment]

A fifth embodiment is an embodiment in which the structure of the memory cell section in the first to third embodiments described above is modified, and is a structure in which a switching element for reading is not used, and the TMR element is disposed at the intersection of the bit line and the word line.

Figure 15:
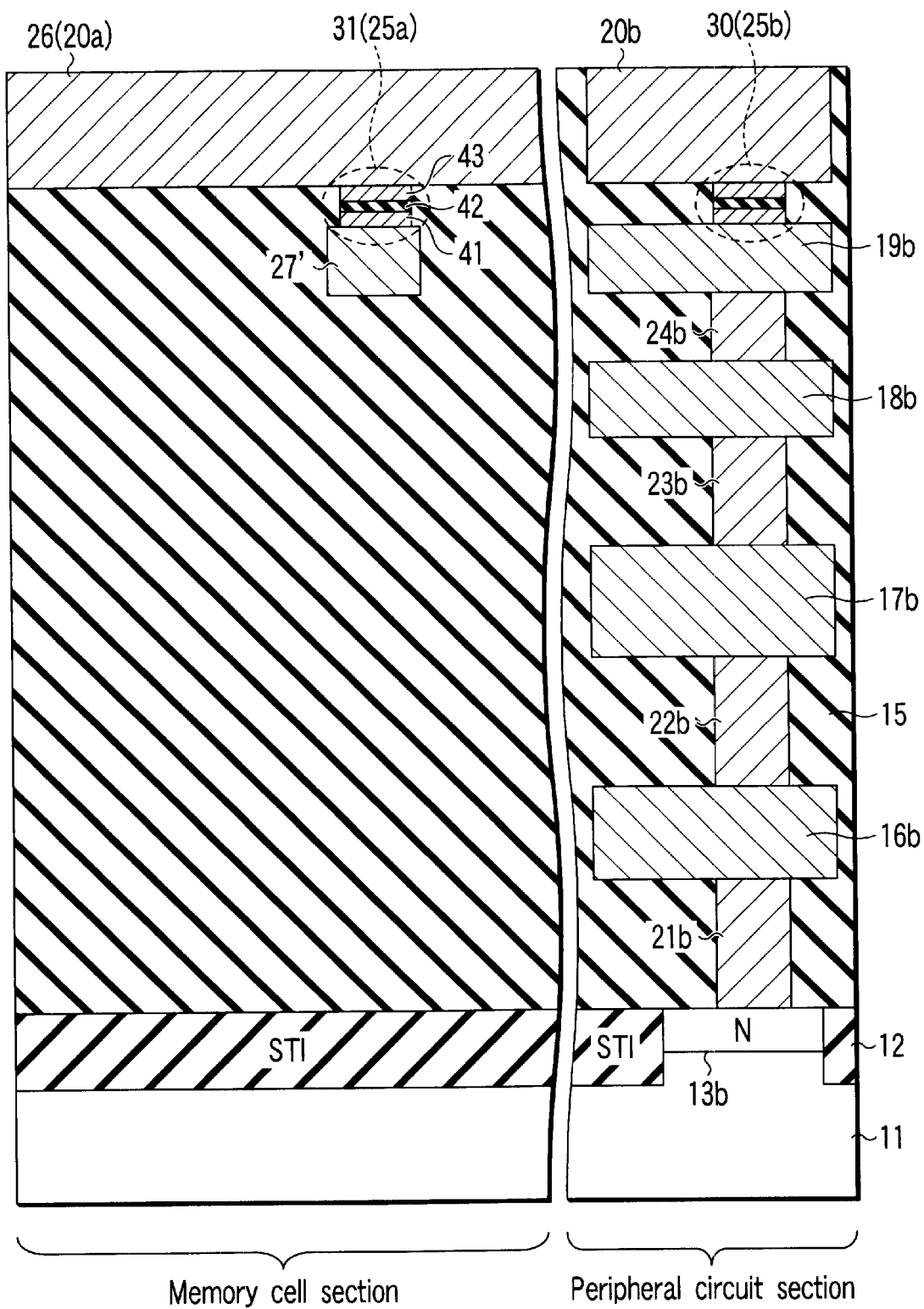
FIG. 15 is a cross-sectional view showing a semiconductor memory device according to a fifth embodiment of the present invention, and in which the memory cell section of the first embodiment is modified.
Figure 17:
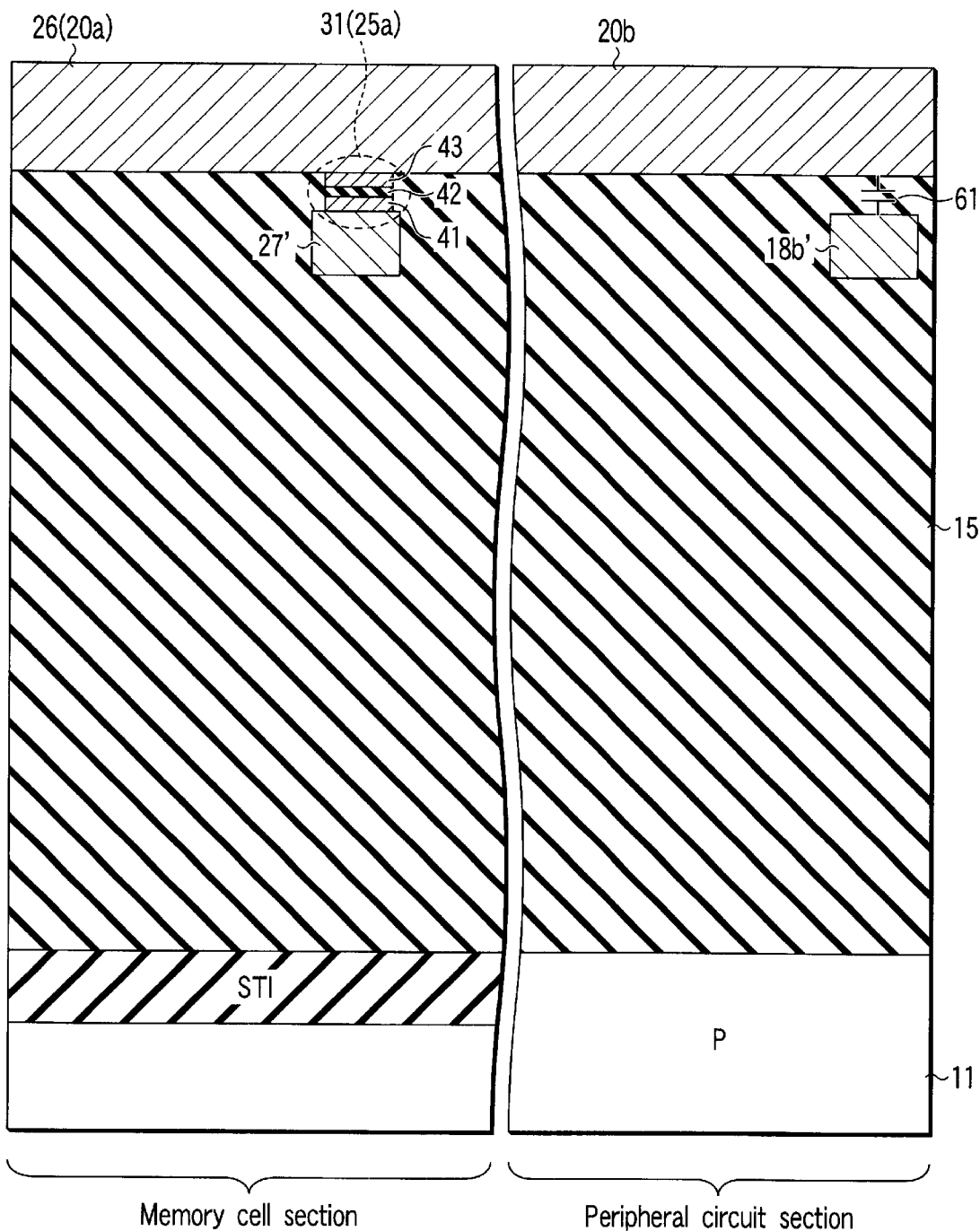
FIG. 17 is a cross-sectional view showing the semiconductor memory device according to the fifth embodiment of the present invention, and in which the memory cell section of the third embodiment is modified.

FIG. 15 to FIG. 17 show cross-sectional views of a semiconductor memory device according to the fifth embodiment of the present invention. In the fifth embodiment, structures which are similar to those of the first to third embodiments will be described simplistically.

In the memory cell section, the TMR element 25*a* used as the memory element 31 is disposed at the intersection of the bit line 26 and the word line 27', and the TMR element 25*a* is connected to the bit line 26 and the word line 27' respectively. Here, the bit line 26 and the word line 27' are used at the time of reading and the time of writing. Further, in the fifth embodiment, a switching element for reading such as that of the first embodiment or the like is not formed.

When such a switching element is not used, data is written to the TMR element 25*a* in the same way as in the first embodiment. Further, reading of data written in the TMR element 25*a* is realized by selecting the bit line 26 and the word line 27' which are connected to the TMR element 25*a*, and making electric current flow to only the TMR element 25*a*, and reading the value of resistance of the TMR element 25*a*.

The structure of the peripheral circuit section is similar to those of the first to third embodiments. Namely, as shown in FIG. 15, the TMR element 25*b* which connects the fourth wiring 19*b* and the fifth wiring 20*b* is used as the resistive element 30. Further, as shown in FIG. 16, the TMR element 25*b* which connects the fourth wiring 19*b* and the fifth wiring 20*b* is used as the fuse element 50. Further, as shown in FIG. 17, the capacitor 61 is formed by the wiring 18*b*', the wiring 20*b*, and the insulating film 15 between these wirings 18*b*', 20*b*.

In accordance with the above-described fifth embodiment, effects which are similar to those of the first to third embodiments can be obtained.

Moreover, in the above-described fifth embodiment, because a switching element for reading is not formed, the area used exclusively for the memory cell section can be reduced more than in the first to third embodiments.

[Sixth Embodiment]

A sixth embodiment is an embodiment in which the structure of the memory cell section in the above-described first to third embodiments is modified, and is a so-called ladder type structure in which both ends of a plurality of TMR elements are connected to wirings.

Figure 18:
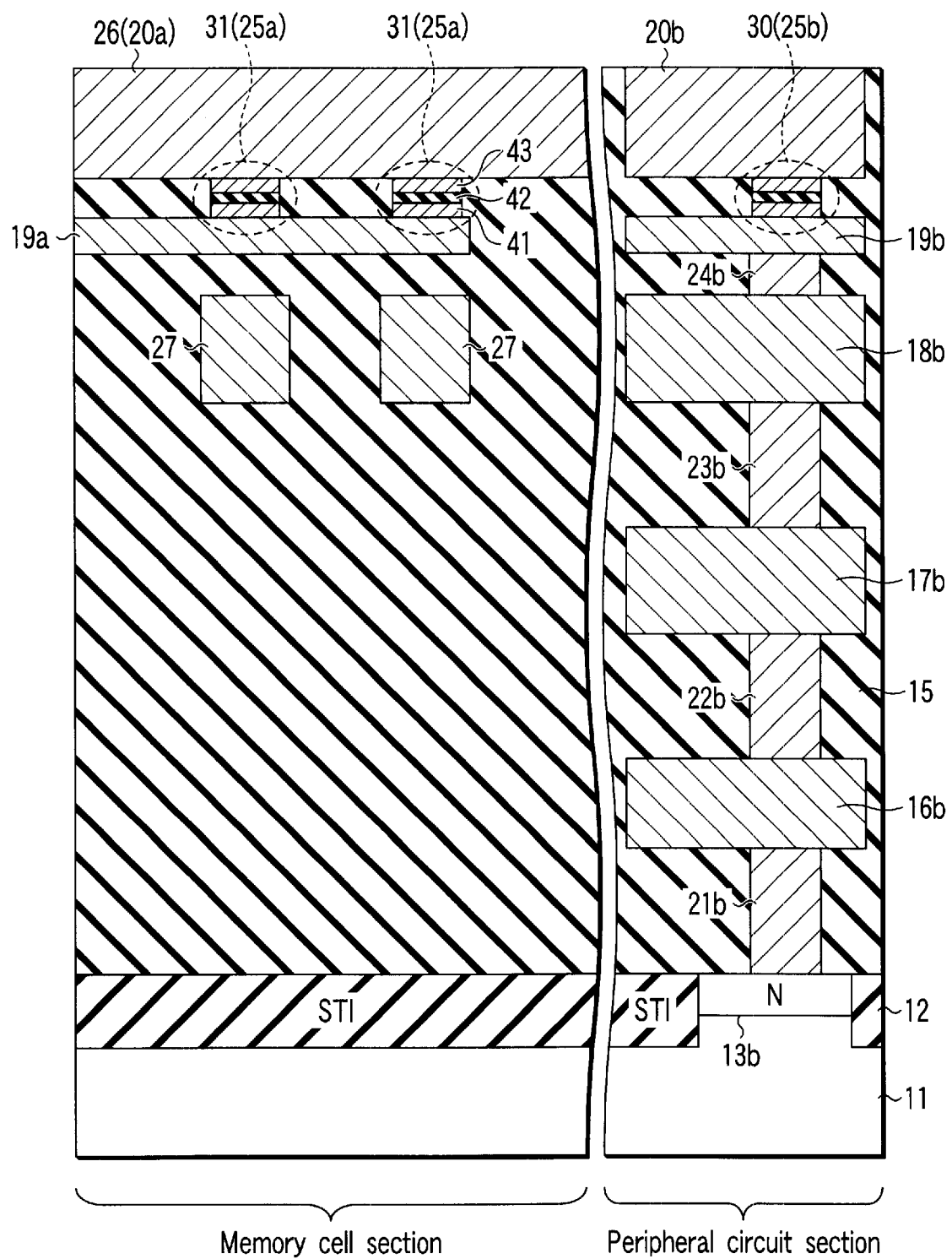
FIG. 18 is a cross-sectional view showing a semiconductor memory device according to a sixth embodiment of the present invention, and in which the memory cell section of the first embodiment is modified.
Figure 20:
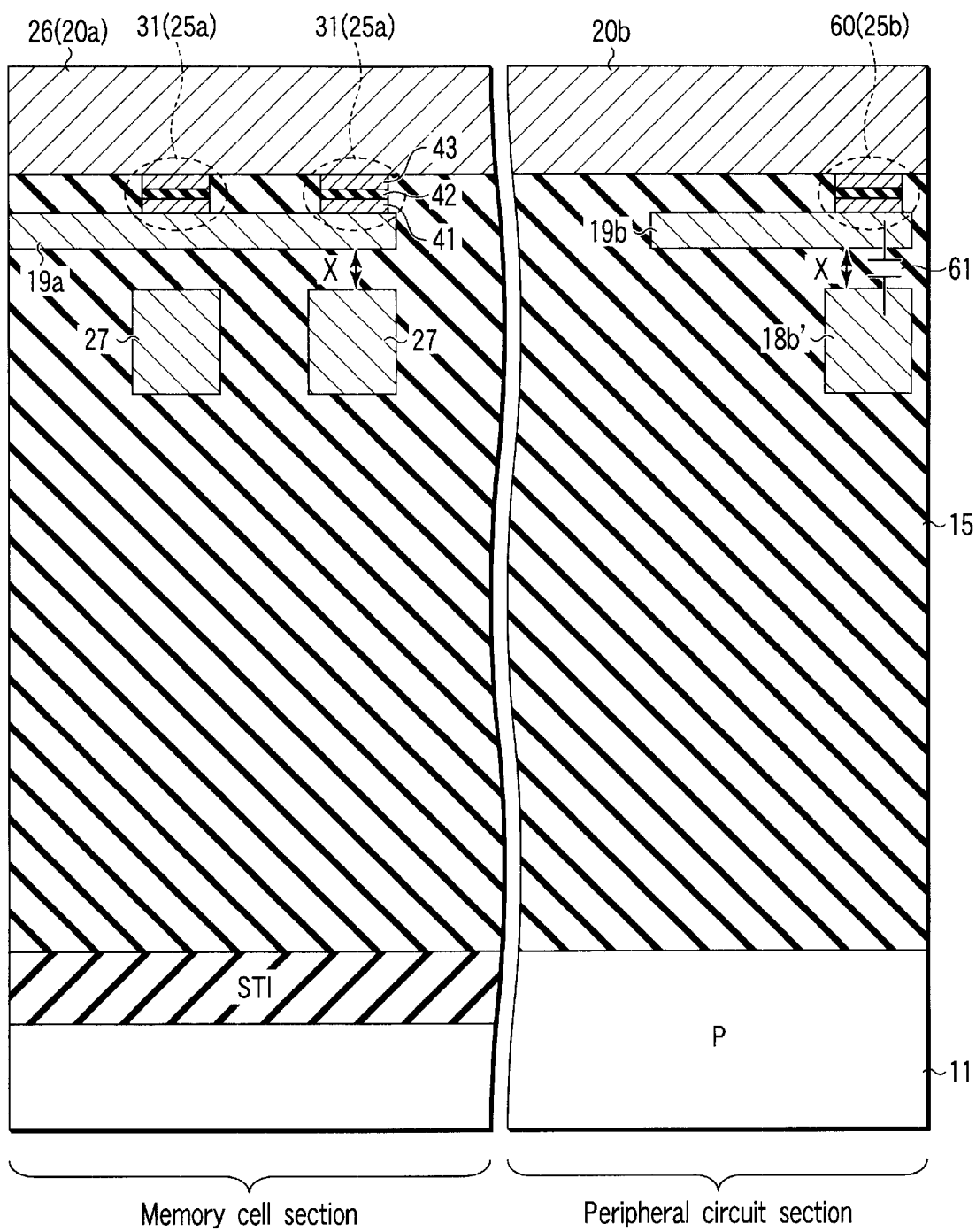
FIG. 20 is a cross-sectional view showing the semiconductor memory device according to the sixth embodiment of the present invention, and in which the memory cell section of the third embodiment is modified.

FIG. 18 to FIG. 20 show cross-sectional views of a semiconductor memory device according to the sixth embodiment of the present invention. In the sixth embodiment, structures which are similar to those of the first to third embodiments will be described briefly.

In the memory cell section, a plurality of TMR elements 25*a* used as the memory elements 31 are disposed in parallel in the same hierarchy. Further, the magnetization fixing layers 41 of the respective TMR elements 25*a* are connected at a lower electrode 19*a*, and the magnetic recording layers 43 of the respective TMR elements 25*a* are connected at the bit line 26. Further, the write word lines 27 are respectively disposed below the TMR elements 25*a* so as to be apart from the lower electrode 19*a*. Further, for example, a transistor for writing (not shown) is connected to the bit line 26, and, for example, a transistor for reading (not shown) is connected to the lower electrode 19*a*.

In this ladder type structure, data is written in a similar way as that of the first embodiment to an arbitrary TMR element 25*a* among the plurality of TMR elements 25*a* connected in parallel. Further, the data written in an arbitrary TMR element 25*a* is read by a method such as the following.

First, in a first cycle, the transistor for reading connected to the lower electrode 19*a* is turned on, and a first reading electric current is made to flow to the plurality of TMR elements 25*a* connected in parallel. Then, the first reading electric current is stored in a sense circuit (not shown). Thereafter, the transistor for reading is turned off, and the reading electric current is turned off.

Next, in a second cycle, writing electric current, by which the data of the expected value "1" or "0" is written, is made to flow to the word line 27 and the bit line 26, and writing of data to an arbitrary TMR element 25a is carried out again. Thereafter, the writing electric current is turned off.

Next, in a third cycle, the transistor for reading is turned on, and a second reading electric current is made to flow to the plurality of TMR elements 25 connected in parallel. Then, the second reading electric current is stored in the sense circuit. Thereafter, the first reading electric current which is stored in the sense circuit in the first cycle and the second reading electric current which is stored in the sense circuit in the third cycle are compared. Here, when the operation of writing data of the expected value "1" is carried out at the time of writing, if the first and second reading electric currents have not changed, the data of "1" is written in an arbitrary TMR element 25a, and if the first and second reading electric currents have changed, the data of "0" is written in an arbitrary TMR element 25a. On the other hand, when the operation of writing data of the expected value "0" is carried out at the time of writing, if the first and second reading electric currents have not changed, the data of "0" is written in an arbitrary TMR element 25a, and if the first and second read electric currents have changed, the data of "1" is written in an arbitrary TMR element 25a. In this way, it is possible to read the data written in an arbitrary TMR element 25a.

Thereafter, in a fourth cycle, electric current is made to flow to the word line 27 and the bit line 26 in order to again write data, which is the same as in an initial (beginning) state, to an arbitrary TMR element 25a, and the operation of reading is completed.

The structure of the peripheral circuit section is similar to those of the first to third embodiments. Namely, as shown in FIG. 18, the TMR element 25b which connects the fourth wiring 19b and the fifth wiring 20b is used as the resistive element 30. Further, as shown in FIG. 19, the TMR element 25b which connects the fourth wiring 19b and the fifth wiring 20b is used as the fuse element 50. Further, as shown in FIG. 20, the capacitor 61 is formed by the third wiring 18b', the fourth wiring 19b, and the insulating film 15 between these wirings 18b', 19b. At this time, the TMR element 25b which connects the fourth wiring 19b and the fifth wiring 20b is used as the contact 60.

In accordance with the above-described sixth embodiment, effects which are similar to those of the first to third embodiments can be obtained.

Moreover, in the sixth embodiment, because a switching element for reading is not formed for each TMR element 25a, the area used exclusively by the memory cell section can be reduced more than in the first to fourth embodiments.

Further, the parallel number of the TMR elements 25a can be increased without the output voltage decreasing to a large extent. Therefore, the degree of integration of the memory cell can be increased. Even if TMR elements 25a whose MR ratios are that much lower are used, or even if the TMR elements 25a whose dispersion of the MR ratios or values of resistance are that much larger are used, a memory cell of a sufficient level in practice can be formed. Accordingly, an MRAM in which the memory cells are disposed at a high density can be realized.

Further, in accordance with the reading operation in the sixth embodiment, the first reading electric current which is stored in the sense circuit in the first cycle and the second reading electric current which is stored in the sense circuit in the third cycle are compared with each other. As a result, when there is no change in the values of the two electric currents, it is determined that writing of the expected value is to be carried out. When there is a change in the values of the two electric currents, it is determined that writing different from the expected value is to be carried out. In this way, in accordance with the sixth embodiment, the margin for determining the data of "1", "0" can be sufficiently ensured.

[Seventh Embodiment]

A seventh embodiment is an embodiment in which the structure in the memory cell section in the above-described first to third embodiments is modified, and is a first layered structure in which the TMR elements are stacked up in the direction of layering. Further, in the first layered structure, the plurality of TMR elements which are layered are connected in series, and the TMR elements connected in series use a read bit line and a switching element for reading in common.

Figure 21:
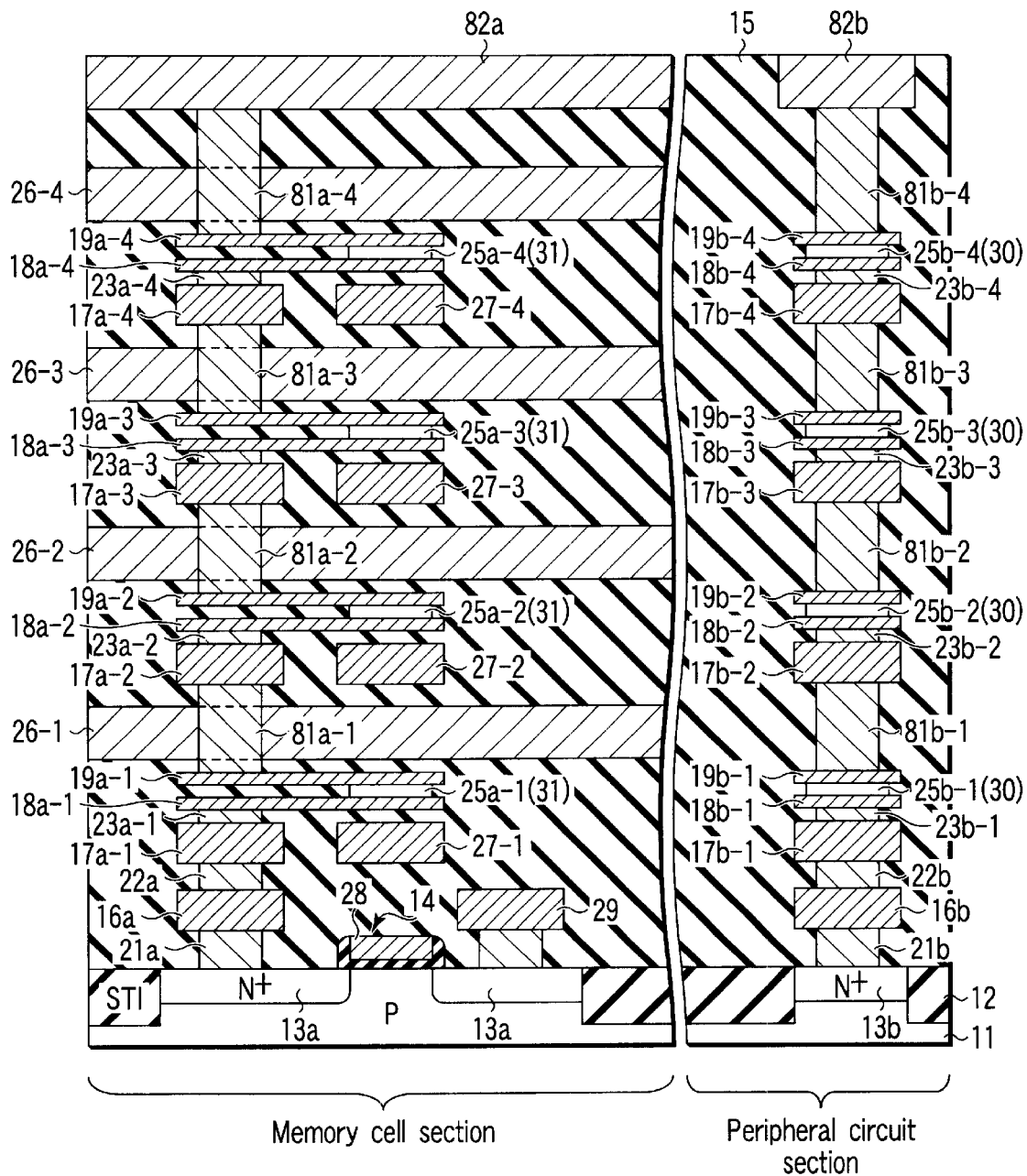
FIG. 21 is a cross-sectional view showing a semiconductor memory device according to a seventh embodiment of the present invention, and in which the memory cell section of the first embodiment is modified.
Figure 22:
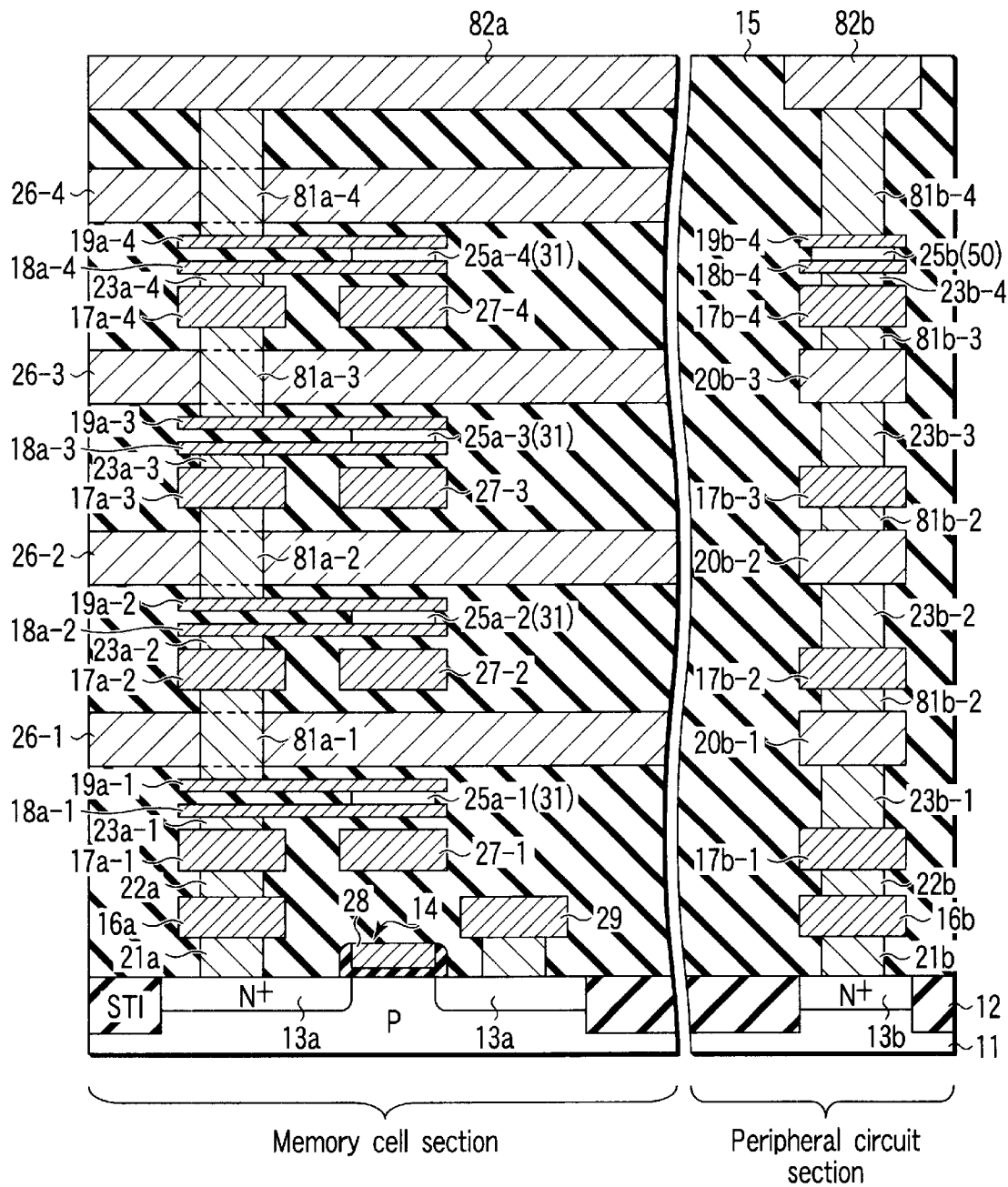
FIG. 22 is a cross-sectional view showing the semiconductor memory device according to the seventh embodiment of the present invention, and in which the memory cell section of the second embodiment is modified.
Figure 23:
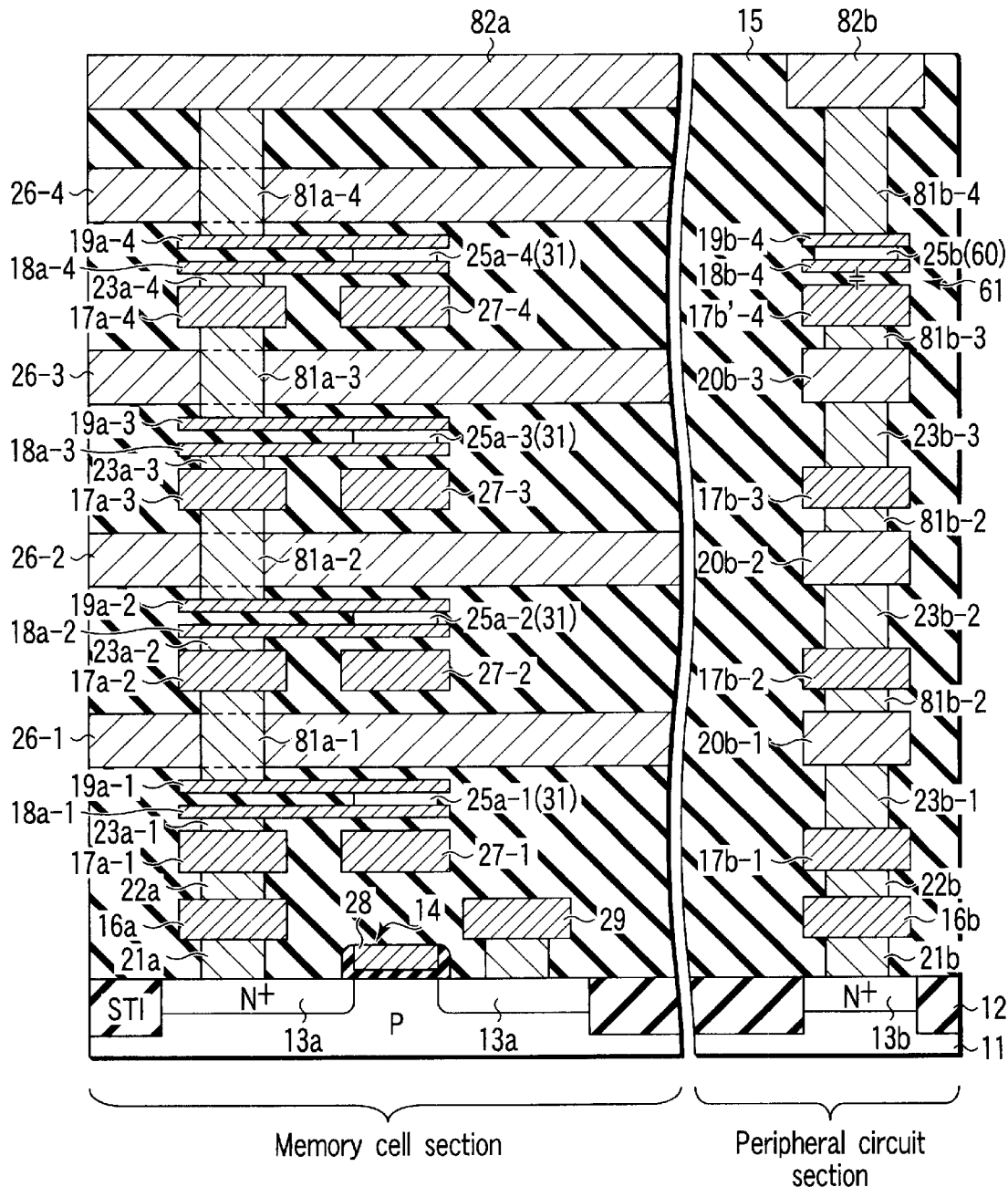
FIG. 23 is a cross-sectional view showing the semiconductor memory device according to the seventh embodiment of the present invention, and in which the memory cell section of the third embodiment is modified.

FIG. 21 to FIG. 23 show cross-sectional views of a semiconductor memory device according to the seventh embodiment of the present invention. In the seventh embodiment, structures which are similar to those of the first to third embodiments will be described simplistically.

In the memory cell section, first to fourth TMR elements 25a–n (n=1, 2, 3, 4) are stacked up in the direction of layering on the semiconductor substrate 11, and the first to fourth TMR elements 25a–n are connected in series. Note that, in the seventh embodiment, an example is given of a case where the four TMR elements 25a–n are stacked up. However, the number of the TMR elements 25a–n is not limited, and may be any number. Hereinafter, an example will be given of a case where the four TMR elements 25a–n are stacked up, and the concrete structure will be described.

The first to fourth TMR elements 25a–n are disposed at the intersection of write bit lines 26-n and a write word line 27-n. Lower portion wirings 18a–n are connected to one end portions of the first to fourth TMR elements 25a–n, and upper portion wirings 19a–n are connected to the other end portions of the first to fourth TMR elements 25a–n.

Further, an upper portion wiring 19a-1 of a first TMR element 25a-1 and a lower portion wiring 18a-2 of a second TMR element 25a-2 are connected via contacts 81a-1, 23a-2, and a wiring 17a-2. An upper portion wiring 19a-2 of the second TMR element 25a-2 and a lower portion wiring 18a-3 of a third TMR element 25a-3 are connected via contacts 81a-2, 23a-3, and a wiring 17a-3. An upper portion wiring 19a-3 of the third TMR element 25a-3 and a lower portion wiring 18a-4 of a fourth TMR element 25a-4 are connected via contacts 81a-3, 23a-4, and a wiring 17a-4.

Further, the MOSFET 14 which is the switching element for reading is connected to a lower portion wiring 18a-1 of the first TMR element 25a-1 via contacts 23a-1, 22a, 21a and wirings 17a-1, 16a. A read bit line 82a is connected to an upper portion wiring 19a-4 of the fourth TMR element 25a-4 via a contact 81a-4. Accordingly, the first to fourth TMR elements 25a–n connected in series use the switching element for reading and a read word line 82a in common.

In the case of such a layered structure, writing and reading of data to an arbitrary TMR element among the first to fourth TMR elements 25a–n which are connected in series are carried out by a similar method as that in the above-described sixth embodiment.

The structure of the peripheral circuit section is similar to those of the first to third embodiments. Namely, as shown in FIG. 21, a first TMR element 25b-1 which connects a third wiring 18b-1 and a fourth wiring 19b-1, a second TMR element 25b-2 which connects a seventh wiring 18b-2 and an eighth wiring 19b-2, a third TMR element 25b-3 which connects an eleventh wiring 18b-3 and a twelfth wiring 19b-3, and a fourth TMR element 25b-4 which connects a fifteenth wiring 18b-4 and a sixteenth wiring 19b-4 are used as the resistive elements 30. Further, as shown in FIG. 22, the TMR element 25b which connects the fifteenth wiring 18b-4 and the sixteenth wiring 19b-4 is used as the fuse element 50. Further, as shown in FIG. 23, the capacitor 61 is formed by a fourteenth wiring 17b'-4, the fifteenth wiring 18b-4, and the insulating film 15 between these fourteenth and fifteenth wirings 17b'-4, 18b-4. At this time, the TMR element 25b which connects the fifteenth wiring 18b-4 and the sixteenth wiring 19b-4 is used as the contact 60.

In accordance with the above-described seventh embodiment, effects similar to those of the first to third embodiments can be obtained.

Moreover, in the seventh embodiment, since a switching element for reading is not formed for each TMR element, the area used exclusively for the memory cell section can be reduced more than in the first to fourth embodiments.

Note that, the switching element for reading data is not limited to the MOSFET 14, and for example, a diode can be used.

[Eighth Embodiment]

An eighth embodiment is an embodiment in which the structure in the memory cell section in the above-described first to third embodiments is modified, and is a second layered structure in which the TMR elements are stacked up in the direction of layering. Further, in the second layered structure, the plurality of TMR elements which are layered are connected in parallel, and the TMR elements connected in parallel use a read bit line and a switching element for reading in common.

Figure 24:
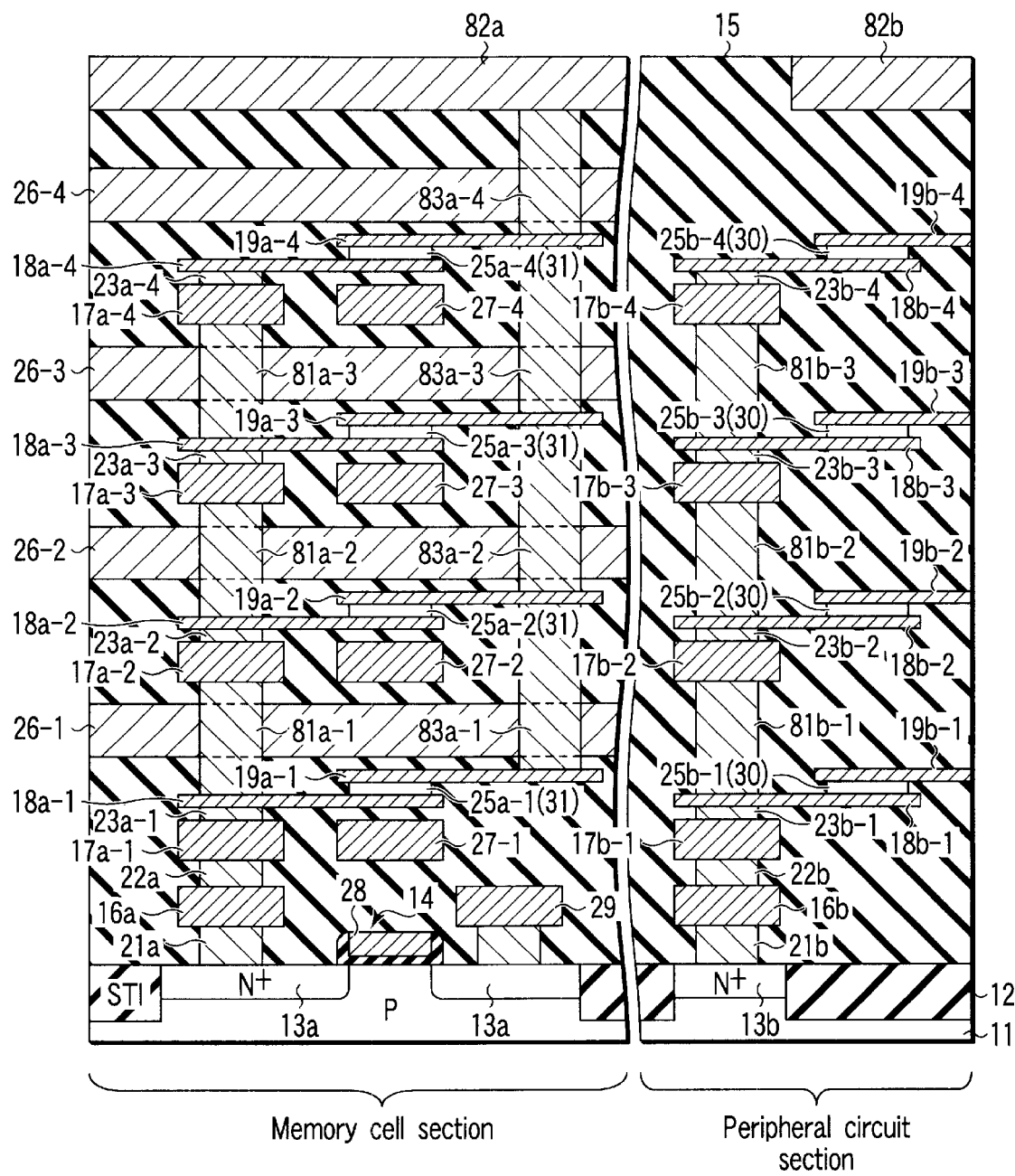
FIG. 24 is a cross-sectional view showing a semiconductor memory device according to an eighth embodiment of the present invention, and in which the memory cell section of the first embodiment is modified.
Figure 25:
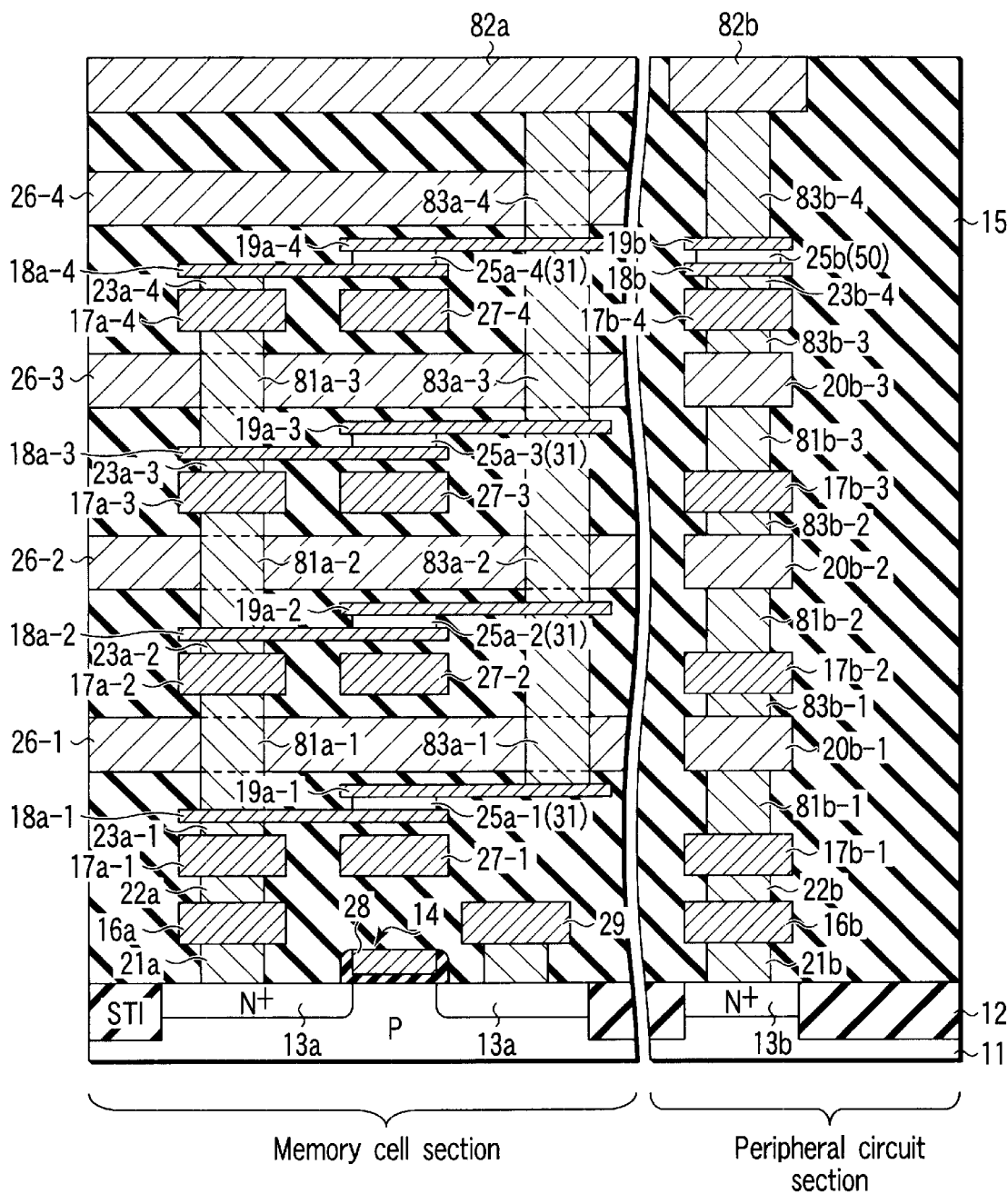
FIG. 25 is a cross-sectional view showing the semiconductor memory device according to the eighth embodiment of the present invention, and in which the memory cell section of the second embodiment is modified.
Figure 26:
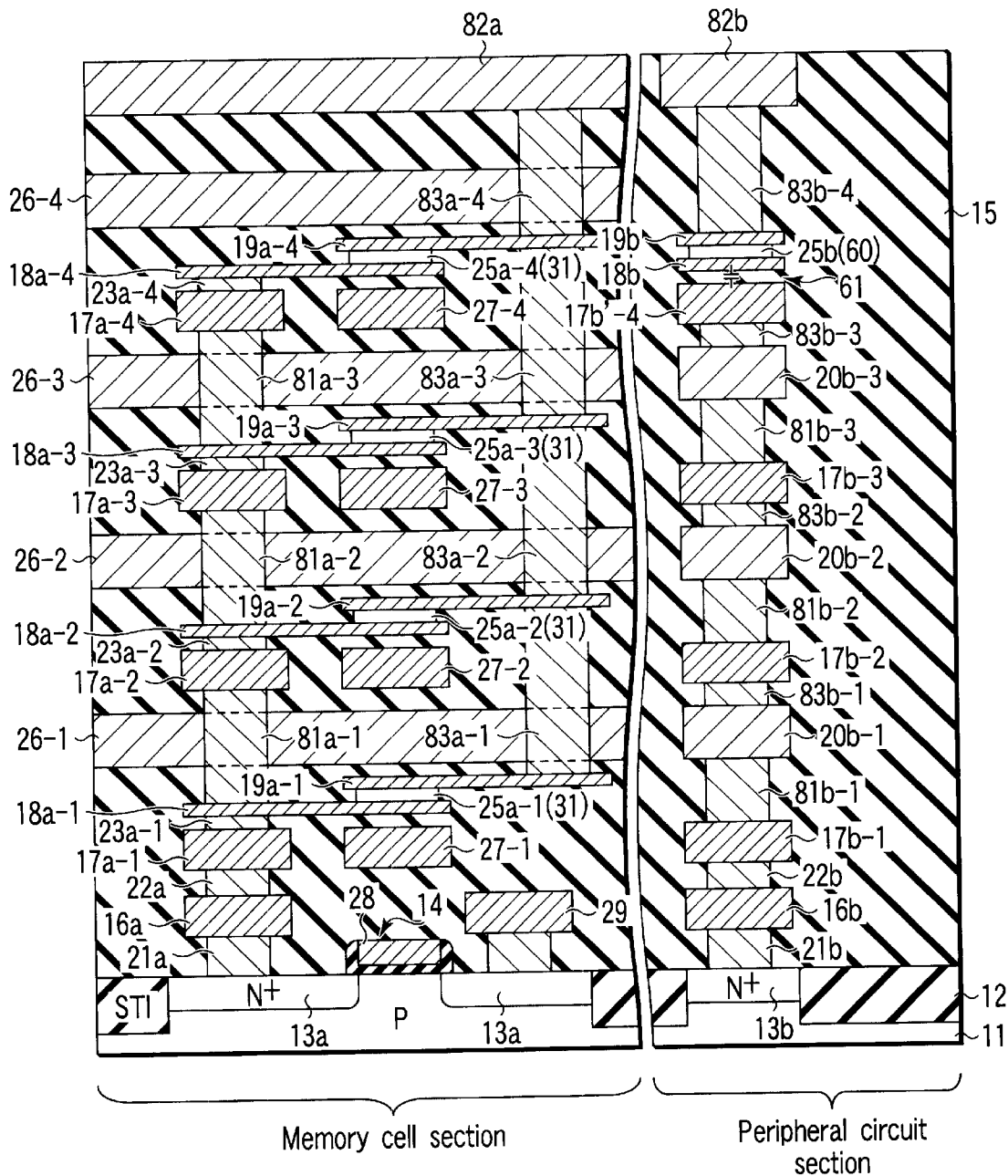
FIG. 26 is a cross-sectional view showing the semiconductor memory device according to the eighth embodiment of the present invention, and in which the memory cell section of the third embodiment is modified.

FIG. 24 to FIG. 26 show cross-sectional views of a semiconductor memory device according to the eighth embodiment of the present invention. In the eighth embodiment, structures which are similar to those of the first to third embodiments will be described briefly.

In the memory cell section, the first to fourth TMR elements 25a–n are stacked up in the direction of layering on the semiconductor substrate 11, and the first to fourth TMR elements 25a–n are connected in series. Note that, in the eighth embodiment, an example is given of a case where the four TMR elements 25a–n are stacked up. However, the number of the TMR elements 25a–n is not limited, and may be any number. Hereinafter, an example will be given of a case where the four TMR elements 25a–n are stacked up, and a concrete structure will be described.

The first to fourth TMR elements 25a–n are disposed at the intersections of the write bit lines 26-n and the write word lines 27-n, respectively. The lower portion wirings 18a–n are connected to one end portions of the first to fourth TMR elements 25a–n, and the upper portion wirings 19a–n are connected to the other end portions of the first to fourth TMR elements 25a–n.

Further, the lower portion wiring 18a-1 of the first TMR element 25a-1 is connected to the lower portion wiring 18a-2 of the second TMR element 25a-2 via the contacts 81a-1, 23a-2, and the wiring 17a-2. The lower portion wiring 18a-2 of the second TMR element 25a-2 is connected to the lower portion wiring 18a-3 of the third TMR element 25a-3 via the contacts 81a-2, 23a-3, and the wiring 17a-3. The lower portion wiring 18a-3 of the third TMR element 25a-3 is connected to the lower portion wiring 18a-4 of the fourth TMR element 25a-4 via the contacts 81a-3, 23a-4, and the wiring 17a-4.

On the other hand, the upper portion wiring 19a-1 of the first TMR element 25a-1 is connected to the upper portion wiring 19a-1 of the second TMR element 25a-2 via a contact 83a-1. The upper portion wiring 19a-2 of the second TMR element 25a-2 is connected to the upper portion wiring 19a-3 of the third TMR element 25a-3 via a contact 83a-2. The upper portion wiring 19a-3 of the third TMR element 25a-3 is connected to the upper portion wiring 19a-4 of the fourth TMR element 25a-4 via a contact 83a-3.

Further, the MOSFET 14 which is a switching element for reading is connected to the lower portion wiring 18a-1 of the first TMR element 25a-1 via the contacts 23a-1, 22a, 21a, and the wirings 17a-1, 16a. The read bit line 82a is connected to the upper portion wiring 19a-4 of the fourth TMR element 25a-4 via the contact 81a-4. Accordingly, the first to fourth TMR elements 25a–n which are connected in parallel use the switching element for reading and the read word line 82a in common.

In the case of such a layered structure, writing and reading of data to an arbitrary TMR element among the first to fourth TMR elements 25a–n which are connected in parallel are carried out by a similar method as in the above-described sixth embodiment.

The structure of the peripheral circuit section is similar to those of the first to third embodiments. Namely, as shown in FIG. 21, the first TMR element 25b-1 which connects the third wiring 18b-1 and the fourth wiring 19b-1, the second TMR element 25b-2 which connects the seventh wiring 18b-2 and the eighth wiring 19b-2, the third TMR element 25b-3 which connects the eleventh wiring 18b-3 and the twelfth wiring 19b-3, and the fourth TMR element 25b-4 which connects the fifteenth wiring 18b-4 and the sixteenth wiring 19b-4 are used as the resistive elements 30. Further, as shown in FIG. 22, the TMR element 25b which connects the fifteenth wiring 18b-4 and the sixteenth wiring 19b-4 is used as the fuse element 50. Further, as shown in FIG. 23, the capacitor 61 is formed by the fourteenth wiring 17b'-4, the fifteenth wiring 18b-4, and the insulating film 15 between these fourteenth and fifteenth wirings 17b'-4, 18b-4. At this time, the TMR element 25b which connects the fifteenth wiring 18b-4 and the sixteenth wiring 19b-4 is used as the contact 60.

In accordance with the above-described eighth embodiment, effects which are similar to those of the first to third embodiments can be obtained.

Moreover, in the eighth embodiment, since a switching element for reading is not formed for each TMR element, the area used exclusively for the memory cell section can be reduced more than in the first to fourth embodiments.

Note that, the switching element for reading data is not limited to the MOSFET 14, and for example, a diode can be used.

[Ninth Embodiment]

A ninth embodiment is an embodiment in which the structure in the memory cell section in the above-described first to third embodiments is modified, and is a third layered structure in which the TMR elements are stacked up in the direction of layering. Further, in the third layered structure, the lower electrodes of the plurality of TMR elements which are layered are connected in series, and the layered plurality of TMR elements use a switching element for reading in common.

Figure 27:
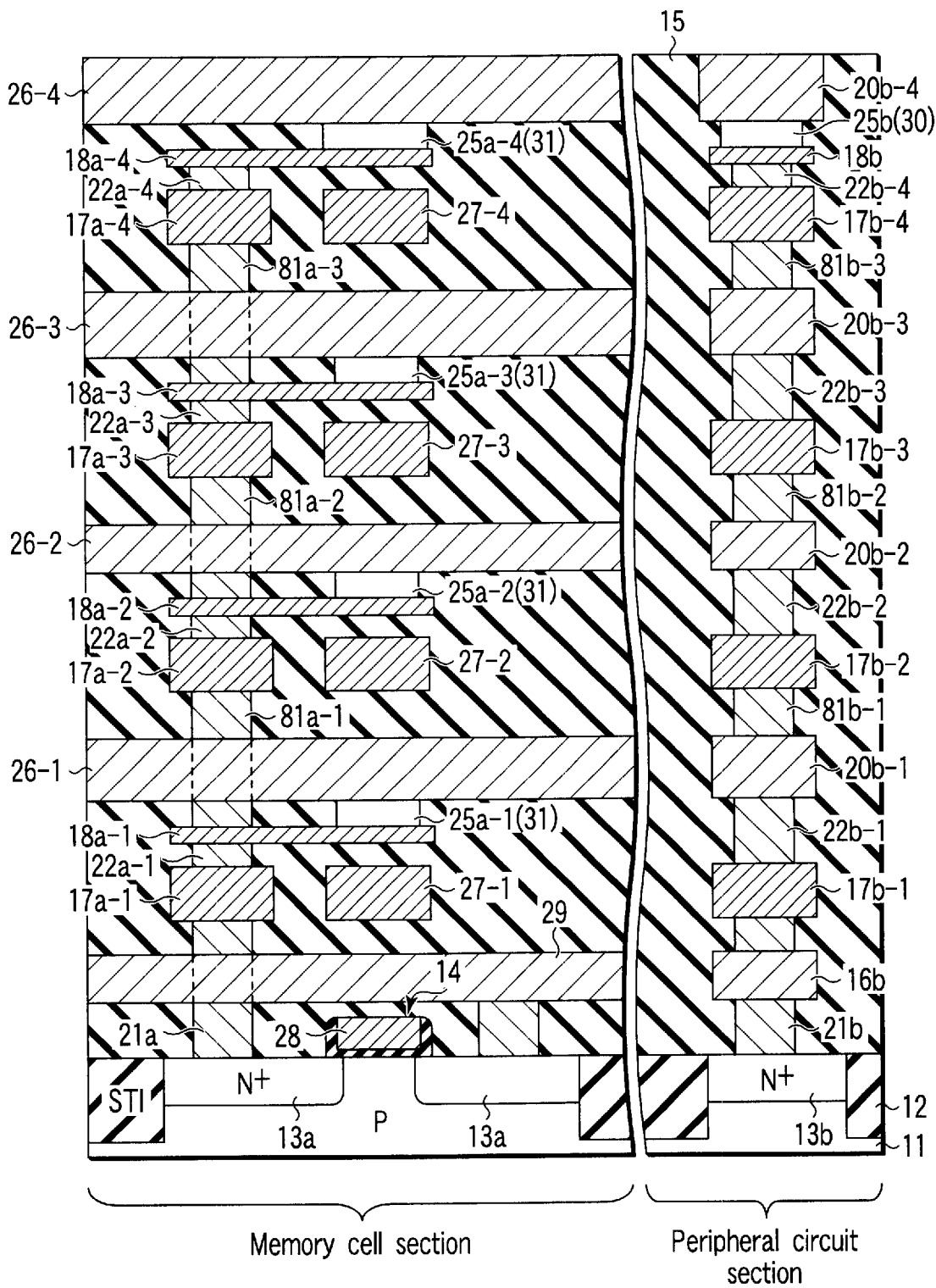
FIG. 27 is a cross-sectional view showing a semiconductor memory device according to a ninth embodiment of the present invention, and in which the memory cell section of the first embodiment is modified.
Figure 28:
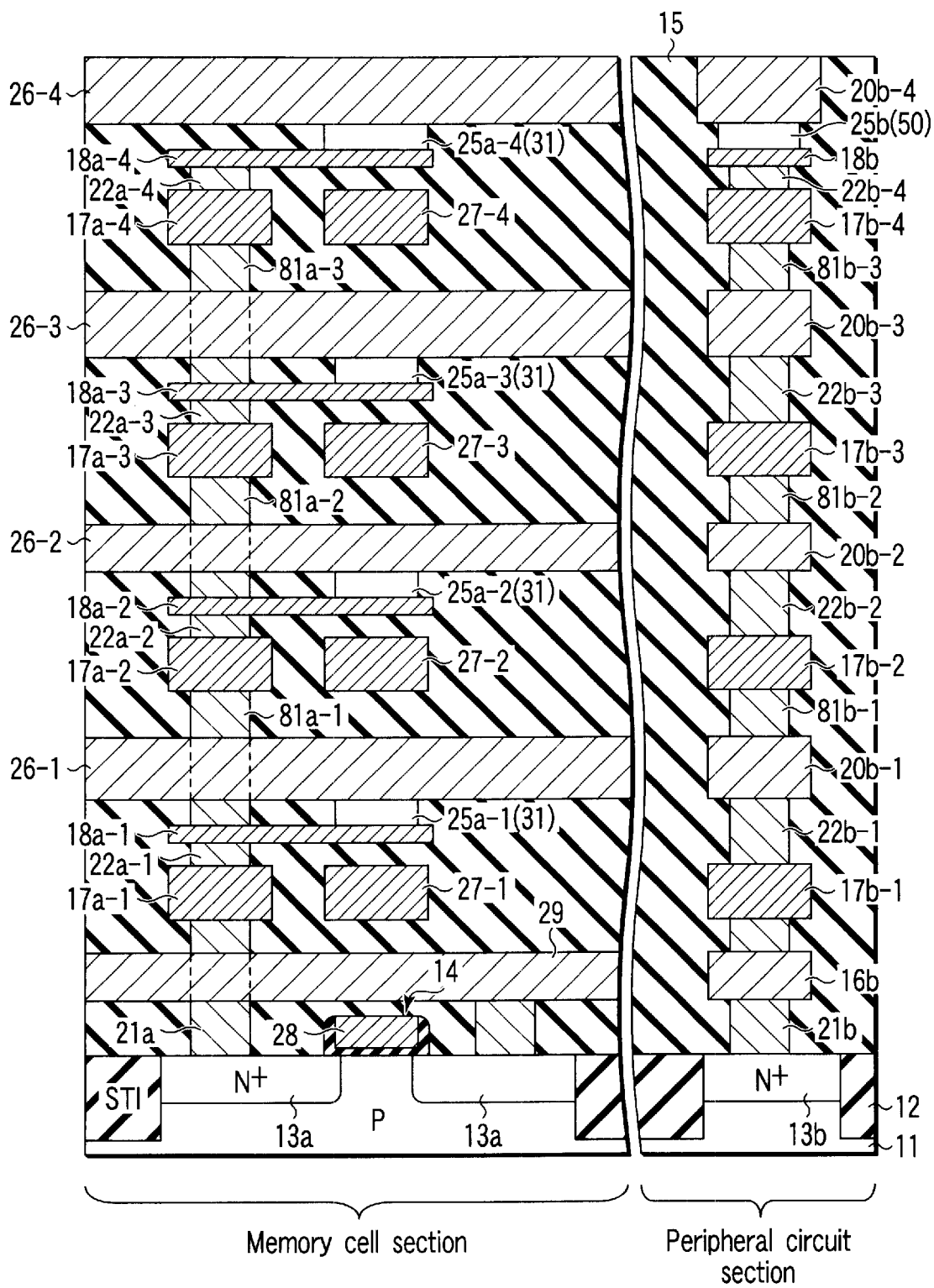
FIG. 28 is a cross-sectional view showing the semiconductor memory device according to the ninth embodiment of the present invention, and in which the memory cell section of the second embodiment is modified.
Figure 29:
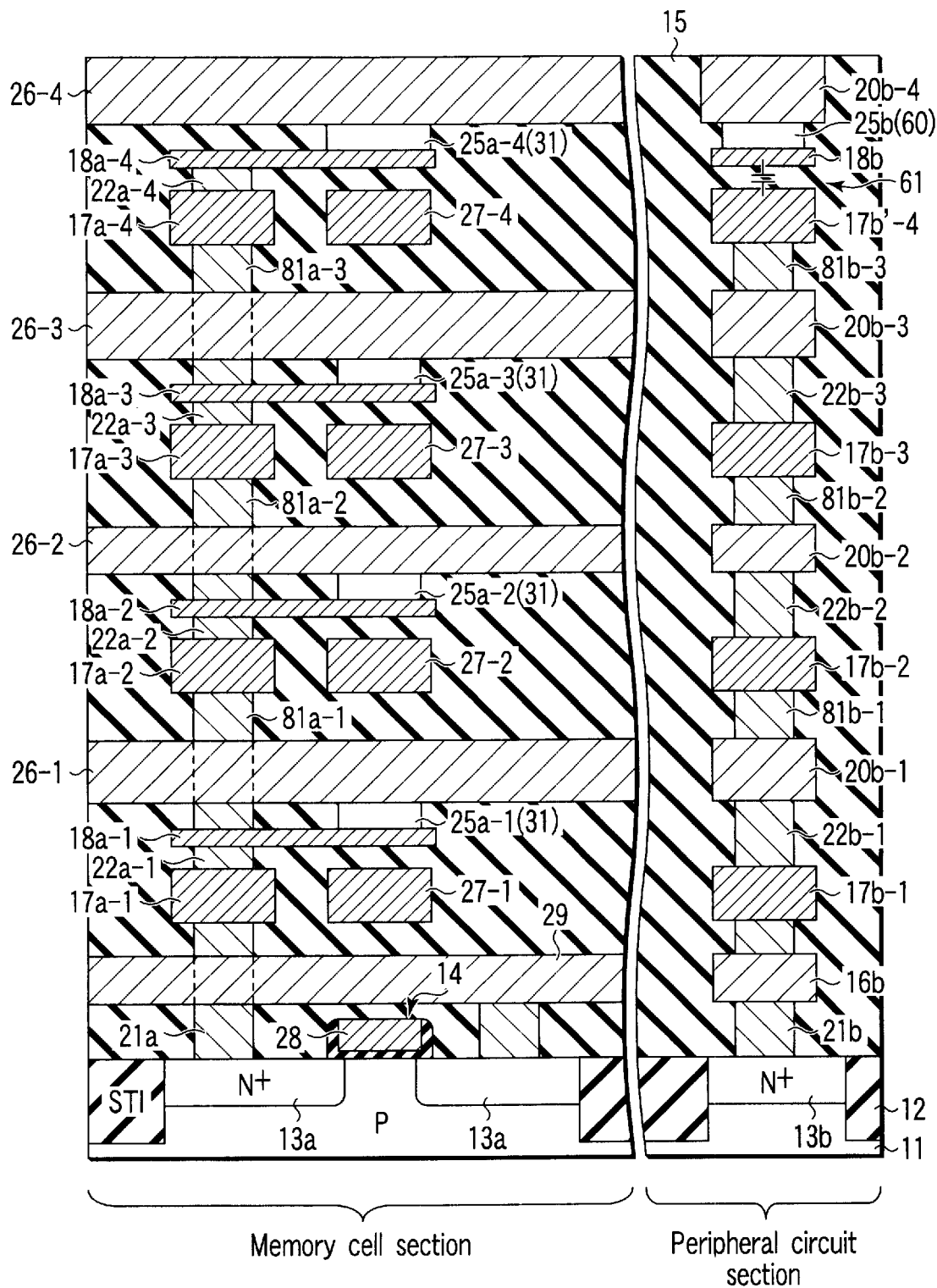
FIG. 29 is a cross-sectional view showing the semiconductor memory device according to the ninth embodiment of the present invention, and in which the memory cell section of the third embodiment is modified.

FIG. 27 to FIG. 29 show cross-sectional views of a semiconductor memory device according to the ninth embodiment of the present invention. In the ninth embodiment, structures which are similar to those of the first to third embodiments will be described simplistically.

In the memory cell section, the first to fourth TMR elements 25a–n are stacked up in the direction of layering on the semiconductor substrate 11. Note that, in the ninth embodiment, an example is given of a case where the four TMR elements 25a–n are stacked up. However, the number of the TMR elements 25a–n is not limited, and may be any number. Hereinafter, an example will be given of a case where the four TMR elements 25a–n are stacked up, and the concrete structure will be described.

The first to fourth TMR elements 25a–n are disposed at the intersections of the bit lines 26-n and the write word lines 27-n, respectively. The lower portion wirings 18a–n are connected to one end portions of the first to fourth TMR elements 25a–n. Further, the lower portion wirings 18a–n of the first to fourth TMR elements 25a–n are connected to the MOSFET 14, which is a switching element for reading, via the contacts 22a–n, 21a, 81a–n, and the wirings 17a–n. Accordingly, the first to fourth TMR elements 25a–n which are stacked up use the switching element for reading in common.

In the case of such a layered structure, writing and reading of data to an arbitrary TMR element among the first to fourth TMR elements 25a–n are carried out by a similar method as in the above-described first embodiment. Note that, at the time of reading data, the MOSFET 14 which is the switching element is commonly used by the first to fourth TMR elements 25a–n which are layered.

The structure of the peripheral circuit section is similar to those of the first to third embodiments. Namely, as shown in FIG. 27, the TMR element 25b which connects the twelfth wiring 18b and a thirteenth wiring 20b-4 is used as the resistive element 30. Further, as shown in FIG. 28, the TMR element 25b which connects the twelfth wiring 18b and the thirteenth wiring 20b-4 is used as the fuse element 50. Further, as shown in FIG. 29, the capacitor 61 is formed by an eleventh wiring 17b'-4, the twelfth wiring 18b, and the insulating film 15 between these eleventh and twelfth wirings 17b'-4, 18b. At this time, the TMR element 25b which connects the twelfth wiring 18b and the thirteenth wiring 20b-4 is used as the contact 60.

In accordance with the above-described ninth embodiment, effects which are similar to those of the first to third embodiments can be obtained.

Moreover, in the ninth embodiment, since a switching element for reading is not formed for each TMR element, the area used exclusively for the memory cell section can be reduced more than in the first to fourth embodiments.

Figure 31:
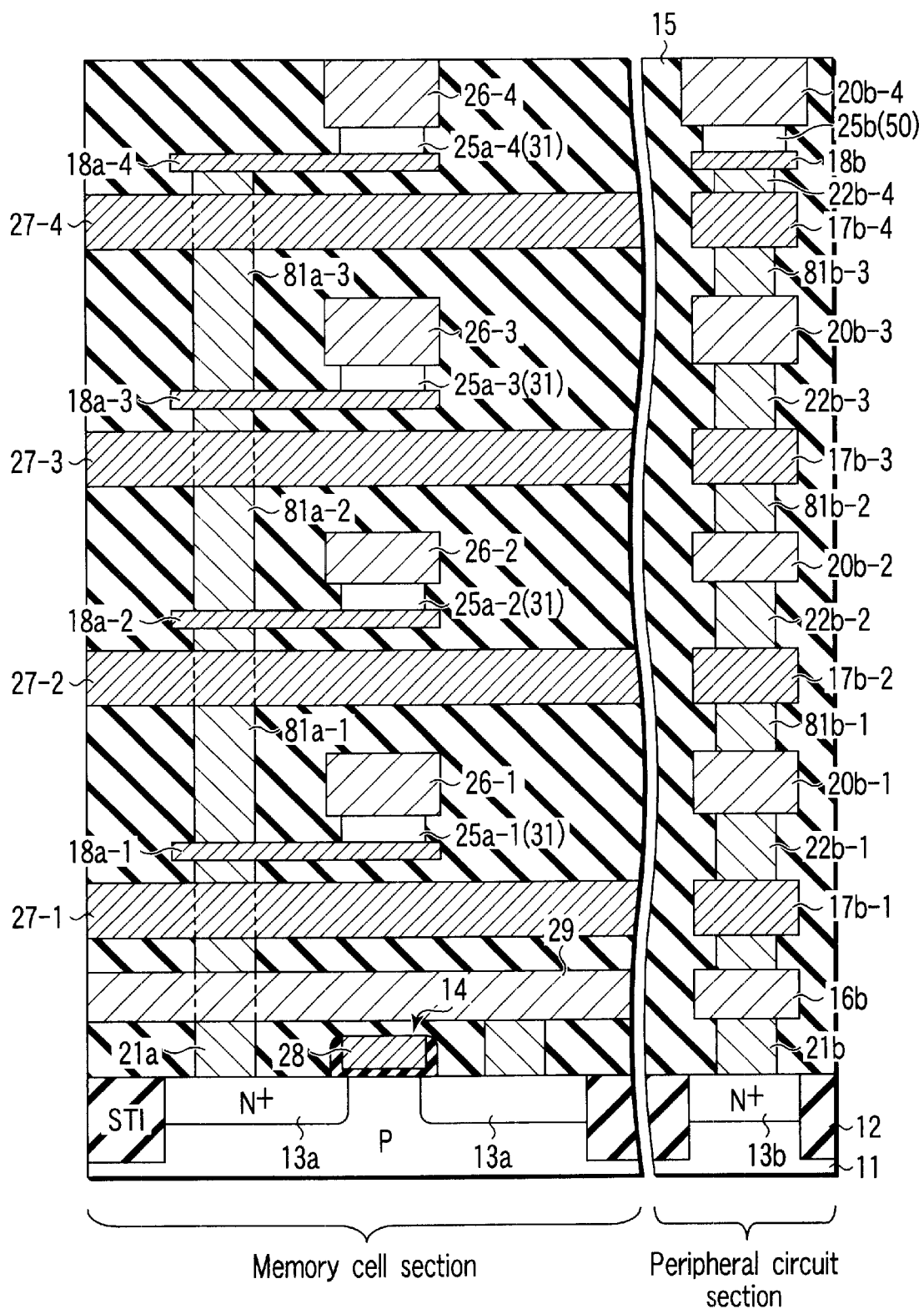
FIG. 31 is a cross-sectional view showing a semiconductor memory device according to a modified example of the ninth embodiment of the present invention, and in which the memory cell section of the second embodiment is modified.
Figure 32:
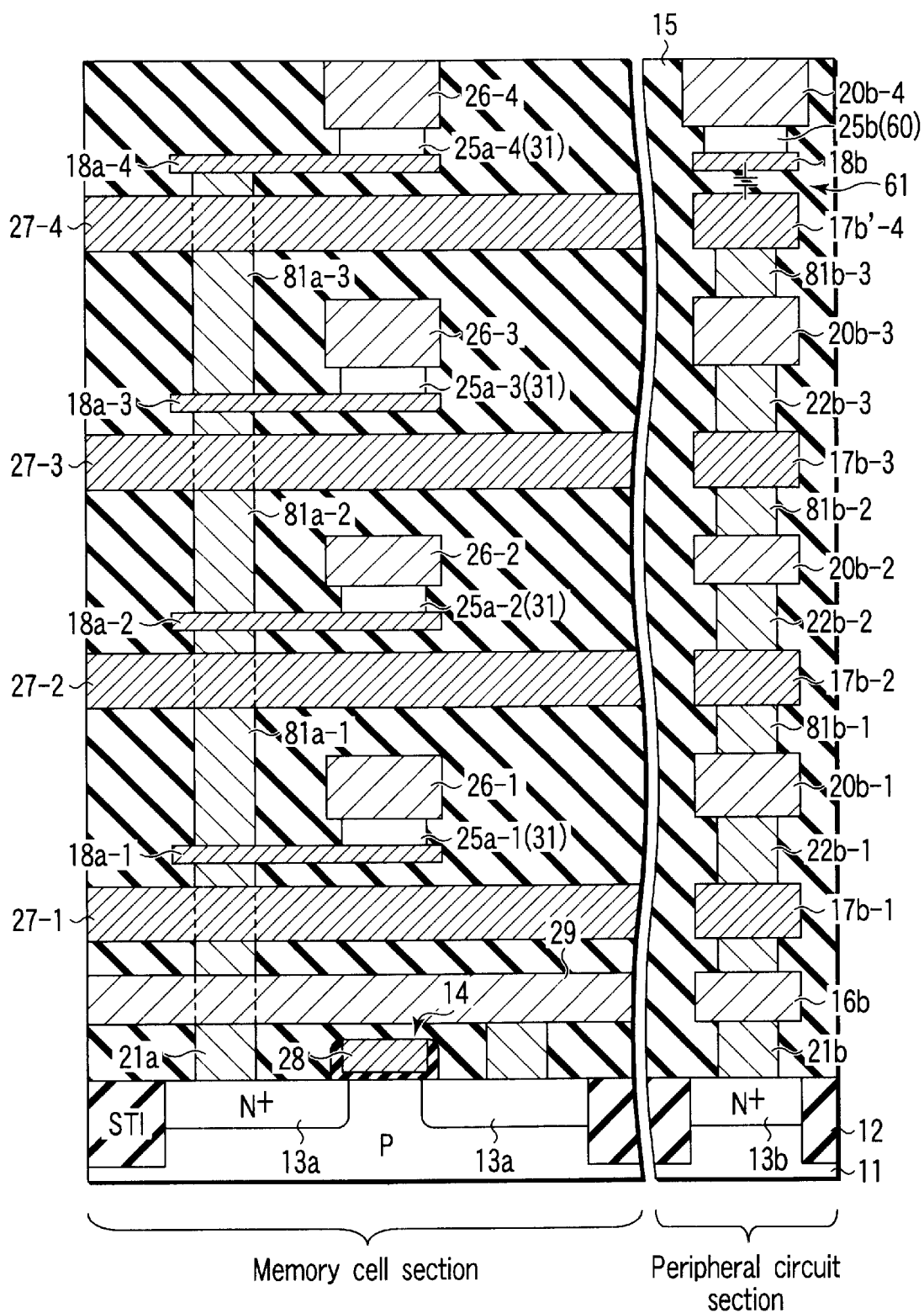
FIG. 32 is a cross-sectional view showing a semiconductor memory device according to a modified example of the ninth embodiment of the present invention, and in which the memory cell section of the third embodiment is modified.
Figure 33:
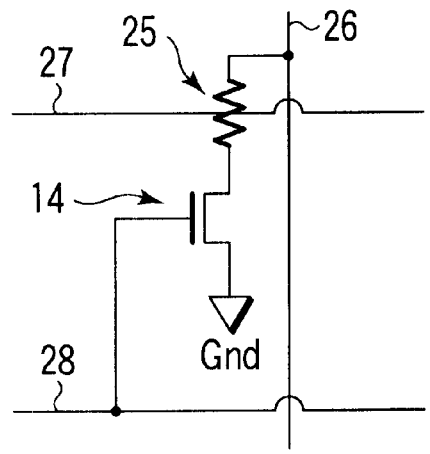
FIG. 33 is a circuit diagram showing a semiconductor memory device in accordance with the prior art.
Figure 34:
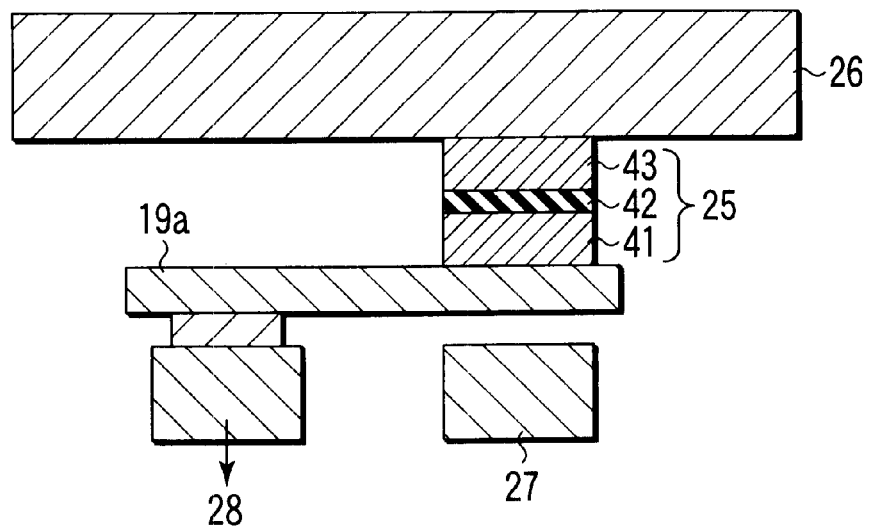
FIG. 34 is a schematic cross-sectional view showing a semiconductor memory device in accordance with the prior art.
Figure 35:
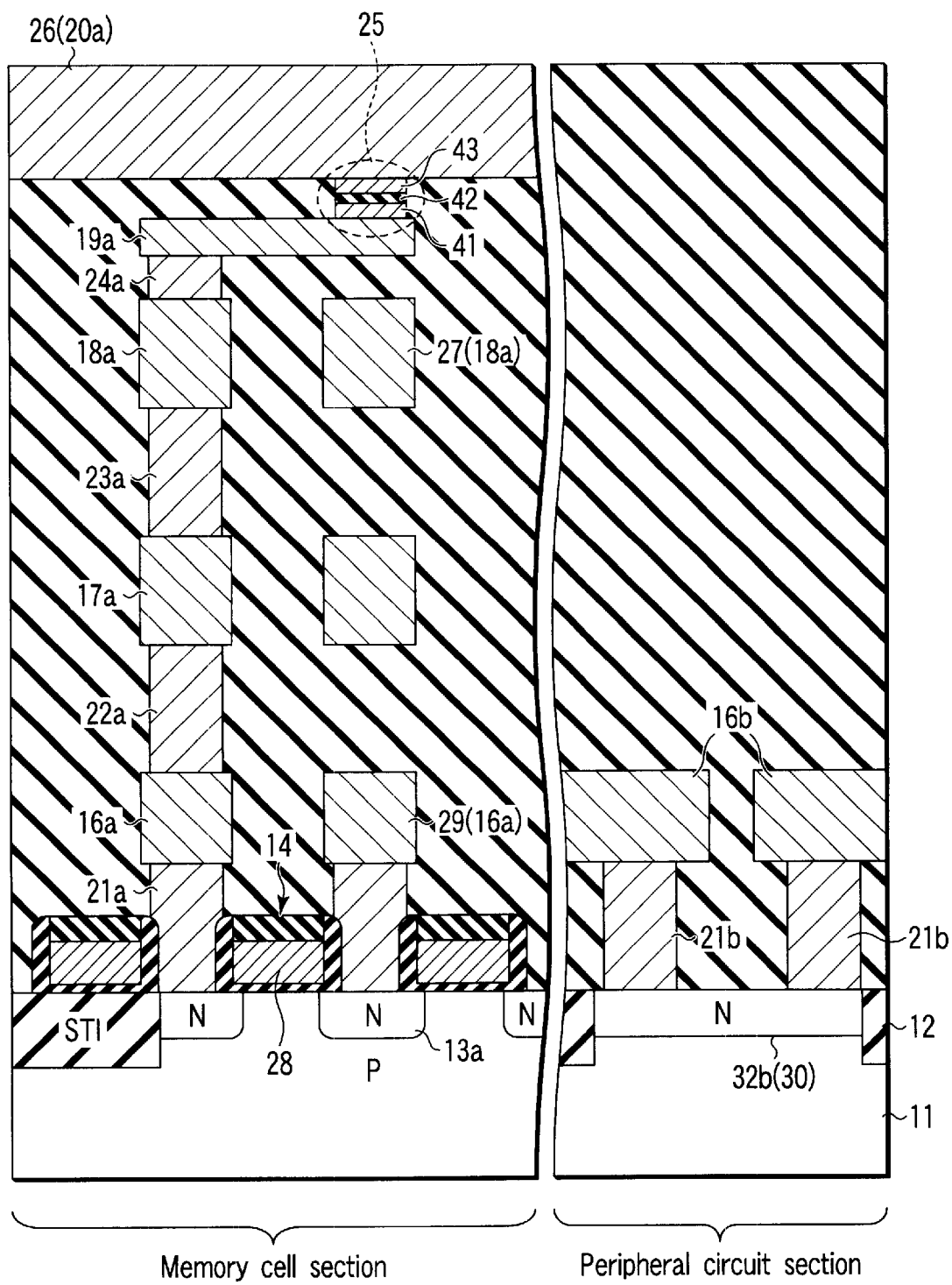
FIG. 35 is a cross-sectional view showing a semiconductor memory device having a resistive element in accordance with the prior art.
Figure 36:
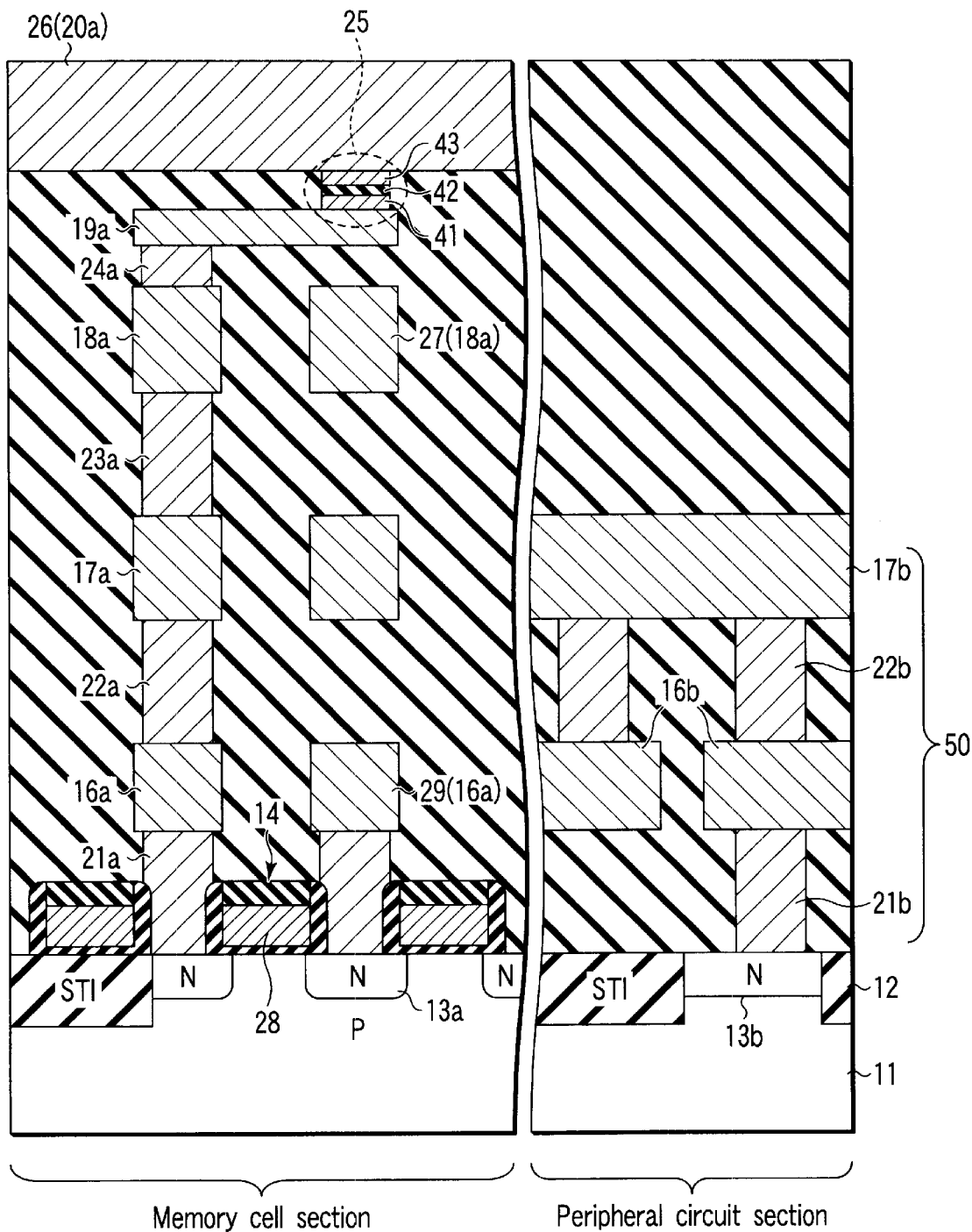
FIG. 36 is a cross-sectional view showing a semiconductor memory device having a fuse element in accordance with the prior art.

Note that, in the structures shown in FIG. 27 to FIG. 29, the bit line 26-n is extended in the same direction as the length of the channel of the MOSFET 14, and the write word line 27-n is extended in a direction shifted by substantially 90° from the length of the channel of the MOSFET 14. However, in the ninth embodiment, the extended directions of the bit line 26-n and the write word line 27-n may be opposite. Namely, as shown in FIG. 30 to FIG. 32, the bit line 26-n may be extended in a direction shifted by substantially 90° from the length of the channel of the MOSFET 14, and the write word line 27-n may be extended in the same direction as the length of the channel of the MOSFET 14.

Further, the switching element for reading data is not limited to the MOSFET 14, and for example, a diode can be used.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

For example, a GMR (Giant Magneto Resistive) element, which is formed from two magnetic layers and a conductor layer sandwiched between these magnetic layers, may be used as the memory element 31 instead of the TMR element. Further, for example, a bipolar transistor or the like may be used instead of the MOSFET 14 used as the switching element for reading.

What is claimed is:

1. A semiconductor memory device comprising a memory cell section and a peripheral circuit section disposed at a periphery of the memory cell section, the memory cell section comprising:

a first wiring which is extended in a first direction;

a second wiring which is disposed above the first wiring and is extended in a second direction different from the first direction;

a third wiring which is disposed between the first and second wirings; and a first magneto resistive effect element which is disposed at an intersection of the first and second wirings between the first and second wirings, and is connected to the second and third wirings, and the peripheral circuit section comprising:

a fourth wiring;

a fifth wiring which is disposed above the fourth wiring; and a second magneto resistive effect element which is disposed between the fourth and fifth wirings and is connected to the fourth and fifth wirings to be used as any of a resistive element, a fuse element, and a contact.

2. A semiconductor memory device comprising a memory cell section and a peripheral circuit section disposed at a periphery of the memory cell section, the memory cell section comprising:

a first wiring which is extended in a first direction;

a second wiring which is disposed above the first wiring and is extended in a second direction different from the first direction; and a first magneto resistive effect element which is disposed at an intersection of the first and second wirings between the first and second wirings, and the peripheral circuit section comprising:

a fourth wiring;

a fifth wiring which is disposed above the fourth wiring; and a second magneto resistive effect element which is disposed between the fourth and fifth wirings and is connected to the fourth and fifth wirings to be used as a resistive element or a fuse element.

3. A semiconductor memory device comprising a memory cell section and a peripheral circuit section disposed at a periphery of the memory cell section, the memory cell section comprising:

first wirings which are extended in a first direction;

a second wiring which is disposed above the first wirings and is extended in a second direction different from the first direction;

a third wiring which is disposed between the first and second wirings; and a plurality of first magneto resistive effect elements which are disposed at intersections of the first and second wirings between the second and third wirings, and are connected to each other in parallel by being connected to the second and third wirings, and the peripheral circuit section comprising:
- a fourth wiring;
- a fifth wiring which is disposed above the fourth wiring; and
- a second magneto resistive effect element which is disposed between the fourth and fifth wirings and is connected to the fourth and fifth wirings to be used as any of a resistive element, a fuse element, and a contact.

4. A semiconductor memory device comprising a memory cell section and a peripheral circuit section disposed at a periphery of the memory cell section, the memory cell section comprising blocks stacked up on a semiconductor substrate, each of the blocks comprising:
- a first wiring which is extended in a first direction;
- a second wiring which is disposed above the first wiring and is extended in a second direction different from the first direction; and
- a first magneto resistive effect element which is disposed at an intersection of the first and second wirings between the first and second wirings, the first magneto resistive effect element comprising one end portion and another end portion, and the first magneto resistive effect elements in the blocks being connected to each other in series or in parallel;
- a third wiring which is connected to the one end portion of the first magneto resistive effect element;
- a sixth wiring which is connected to the other end portion of the first magneto resistive effect element, and the peripheral circuit section comprising:
- a fourth wiring;
- a fifth wiring which is disposed above the fourth wiring; and
- a second magneto resistive effect element which is disposed between the fourth and fifth wirings and is connected to the fourth and fifth wirings to be used as any of a resistive element, a fuse element, and a contact.

5. A semiconductor memory device comprising a memory cell section and a peripheral circuit section disposed at a periphery of the memory cell section, the memory cell section comprising blocks stacked up on a semiconductor substrate, each of the block comprising:
- a first wiring which is extended in a first direction;
- a second wiring which is disposed above the first wiring and is extended in a second direction different from the first direction;
- a third wiring which is disposed between the first and second wirings, the third wirings in the blocks are connected to each other; and
- a first magneto resistive effect element which is disposed at an intersection of the first and second wirings between the second and third wirings and which is connected to the second and third wirings, and the peripheral circuit section comprising:
- a fourth wiring;
- a fifth wiring which is disposed above the fourth wiring; and
- a second magneto resistive effect element which is disposed between the fourth and fifth wirings and is connected to the fourth and fifth wirings to be used as any of a resistive element, a fuse element, and a contact.

6. A semiconductor memory device according to claim 1, further comprising:
- a transistor or a diode which is connected to the first magneto resistive effect element.

7. A semiconductor memory device according to claim 4, further comprising:
- a transistor or a diode which is connected to one end portions of the first magneto resistive effect elements which are connected to each other in series or in parallel; and
- a seventh wiring which is connected to other end portions of the first magneto resistive effect elements which are connected to each other in series or in parallel.

8. A semiconductor memory device according to claim 5, further comprising:
- a transistor or a diode which is connected to the third wirings connected to each other.

9. A semiconductor memory device according to claim 1, wherein when the second magneto resistive effect element is used as the resistive element, a plurality of the second magneto resistive effect elements are disposed in the second direction, and a value of resistance of the resistive element is varied by connecting the plurality of second magneto resistive effect elements in series or in parallel.

10. A semiconductor memory device according to claim 1, wherein when the second magneto resistive effect element is used as the resistive element, a value of resistance of the resistive element is varied by changing a film thickness of a non-magnetic layer which forms one portion of the second magneto resistive effect element.

11. A semiconductor memory device according to claim 1, wherein when the second magneto resistive effect element is used as the resistive element, a value of resistance of the resistive element is varied by making directions of magnetization of first and second magnetic layers, which form one portion of the second magneto resistive effect element, be parallel or anti-parallel.

12. A semiconductor memory device according to claim 1, wherein when the second magneto resistive effect element is used as the contact, the semiconductor memory device further comprises:
- a eighth wiring which is disposed to be apart from the fourth wiring; and
- an insulating film which is formed between the eighth wiring and the fourth wiring, and
- a capacitor is formed from the insulating film, the fourth wiring, and the eighth wiring.

13. A semiconductor memory device according to claim 1, wherein the first magneto resistive effect element and the second magneto resistive effect element are formed in the same level.

14. A semiconductor memory device according to claim 1, wherein the second wiring and the fifth wiring are formed in the same level, and the third wiring and the fourth wiring are formed in the same level.

15. A semiconductor memory device according to claim 1, wherein the first and second magneto resistive effect elements are TMR elements or GMR elements.

16. A semiconductor memory device according to claim 1, wherein the first and second magneto resistive effect elements are TMR elements, the TMR elements are a single junction structure including one non-magnetic layer or a double junction structure including two non-magnetic layers.

17. A semiconductor memory device according to claim 3, wherein, by making electric current flow to the first wiring and one of the second and the third wirings, a first or second state is written in an arbitrary first magneto resistance effect element among the plurality of first magneto resistance effect elements.

18. A semiconductor memory device according to claim 17, wherein first electric current is made to flow to the plurality of first magneto resistance effect elements, and a first electric current value of the first electric current is stored, the first or the second state is again written in the arbitrary first magneto resistance effect element, and thereafter, second electric current is made to flow to the plurality of first magneto resistance effect elements, and a second electric current value of the second electric current is stored, and by comparing the first electric current value and the second electric current value, the first or the second state written in the arbitrary first magneto resistance effect element is distinguished.

19. A semiconductor memory device according to claim 4, wherein, by making electric current flow to the first wiring and the second wiring, a first or second state is written in an arbitrary first magneto resistance effect element among the first magneto resistance effect elements connected to each other in series or in parallel.

20. A semiconductor memory device according to claim 19, wherein first electric current is made to flow to the first magneto resistance effect elements connected to each other in series or in parallel, and a first electric current value of the first electric current is stored, the first or the second state is again written in the arbitrary first magneto resistance effect element, and thereafter, second electric current is made to flow to the first magneto resistance effect elements connected to each other in series or in parallel, and a second electric current value of the second electric current is stored, and by comparing the first electric current value and the second electric current value, the first or the second state written in the arbitrary first magneto resistance effect element is distinguished.

* * * * *